US010756701B2

(12) United States Patent
Lee et al.

(10) Patent No.: US 10,756,701 B2
(45) Date of Patent: Aug. 25, 2020

(54) BULK ACOUSTIC WAVE RESONATOR

(71) Applicant: Samsung Electro-Mechanics Co., Ltd., Suwon-si (KR)

(72) Inventors: Tae Kyung Lee, Suwon-si (KR); Ran Hee Shin, Suwon-si (KR); Je Hong Kyoung, Suwon-si (KR); Hwa Sun Lee, Suwon-si (KR); Jin Suk Son, Suwon-si (KR); Sung Sun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 40 days.

(21) Appl. No.: 16/039,952

(22) Filed: Jul. 19, 2018

(65) Prior Publication Data
US 2019/0058451 A1    Feb. 21, 2019

(30) Foreign Application Priority Data

Aug. 17, 2017  (KR) .......................... 10-2017-0104419
Feb. 19, 2018  (KR) .......................... 10-2018-0019390

(51) Int. Cl.
*H03H 9/02*    (2006.01)
*H03H 9/54*    (2006.01)
*H03H 9/13*    (2006.01)
*H03H 9/17*    (2006.01)

(52) U.S. Cl.
CPC ........ *H03H 9/131* (2013.01); *H03H 9/02015* (2013.01); *H03H 9/173* (2013.01); *H03H 9/175* (2013.01)

(58) Field of Classification Search
CPC .................................. H03H 9/54; H03H 9/02

USPC .................................................. 333/187, 189
See application file for complete search history.

(56) References Cited

U.S. PATENT DOCUMENTS

| 7,057,477 | B2 * | 6/2006 | Wang ....................... H03H 3/02 |
| | | | 310/324 |
| 7,482,737 | B2 * | 1/2009 | Yamada ................... H03H 3/02 |
| | | | 310/363 |
| 9,679,765 | B2 | 6/2017 | Larson, III et al. |
| 10,193,526 | B2 * | 1/2019 | Lee ........................... H03H 3/02 |
| 2005/0077803 | A1 | 4/2005 | Ha et al. |
| 2006/0132262 | A1 * | 6/2006 | Fazzio ............... H03H 9/02118 |
| | | | 333/187 |
| 2007/0284971 | A1 | 12/2007 | Sano et al. |

(Continued)

FOREIGN PATENT DOCUMENTS

| JP | 5-183378 A | 7/1993 |
| JP | 5-211147 A | 8/1993 |

(Continued)

OTHER PUBLICATIONS

Acoustic Properties for Metals in Solid Form, 2019, NDT Resource Center, 4 pages. (Year: 2019).*

(Continued)

*Primary Examiner* — Dean O Takaoka
(74) *Attorney, Agent, or Firm* — NSIP Law

(57) ABSTRACT

A bulk acoustic wave resonator includes: a substrate; a lower electrode disposed on the substrate; a piezoelectric layer at least partially disposed on the lower electrode; and an upper electrode disposed on the piezoelectric layer, wherein either one or both of the lower electrode and the upper electrode includes a layer of aluminum alloy including scandium (Sc).

28 Claims, 19 Drawing Sheets

(56) References Cited

U.S. PATENT DOCUMENTS

| | | | |
|---|---|---|---|
| 2008/0074005 A1* | 3/2008 | Sano | H01L 41/316 310/363 |
| 2011/0298564 A1 | 12/2011 | Iwashita et al. | |
| 2013/0176086 A1* | 7/2013 | Bradley | H03H 9/1007 333/189 |
| 2014/0246305 A1* | 9/2014 | Larson, III | C23C 14/022 204/192.18 |
| 2014/0354110 A1 | 12/2014 | Araki et al. | |
| 2015/0244347 A1 | 8/2015 | Feng et al. | |
| 2015/0280679 A1 | 10/2015 | Nikkel et al. | |
| 2015/0280687 A1* | 10/2015 | Burak | H03H 9/132 310/321 |
| 2016/0163954 A1 | 6/2016 | Shin et al. | |
| 2017/0170809 A1 | 6/2017 | Yokoyama et al. | |

FOREIGN PATENT DOCUMENTS

| | | |
|---|---|---|
| JP | 5-267976 A | 10/1993 |
| JP | 2005-117669 A | 4/2005 |
| JP | 2007-335977 A | 12/2007 |
| JP | 2015-162905 A | 9/2015 |
| JP | 2015-188216 A | 10/2015 |
| JP | 5839103 B2 | 1/2016 |
| JP | 2017-112437 A | 6/2017 |
| KR | 10-2016-0069263 A | 6/2016 |
| WO | WO 2010/095640 A1 | 8/2010 |

OTHER PUBLICATIONS

Vickers Hardness of the elements, 2019, Wolfram Research 2 pages. (Year: 2019).*

Japanese Office Action dated Jul. 9, 2019 in counterpart Japanese Patent Application No. 2018-133605 (6 pages in English and 3 pages in Japanese).

Korean Office Action dated Jun. 28, 2019 in counterpart Korean Patent Application No. 10-2018-0019390 (5 pages in English and 5 pages in English).

* cited by examiner

BULK ACOUSTIC WAVE RESONATOR

CROSS-REFERENCE TO RELATED APPLICATIONS

This application claims the benefit under 335 U.S.C. § 119(a) of Korean Patent Application Nos. 10-2017-0104419 and 10-2018-0019390 filed on Aug. 17, 2017 and Feb. 19, 2018, respectively, in the Korean Intellectual Property Office, the entire disclosures of which are incorporated herein by reference for all purposes.

BACKGROUND

1. Field

The following description relates to a bulk acoustic wave resonator.

2. Description of Related Art

Recently, interest in 5G communications technology has increased and technical developments, which may be implemented in candidate bands of 5G communications, have been performed.

A frequency band which may be implemented by a film bulk acoustic resonator (FBAR) is about 6 GHz or less. In the case of a film bulk acoustic resonator operating in a frequency band of 2 to 3 GHz, a suitable thickness of an electrode and a suitable thickness of a piezoelectric layer may be easily implemented. However, in the case of a film bulk acoustic resonator operating in a frequency band of 5 GHz, considerable manufacturing difficulties and deteriorations in performance may occur.

In particular, in the case of the film bulk acoustic resonator operating in the frequency band of 5 GHz, an ultra-thin film electrode needs to be implemented and the piezoelectric layer also needs to be thin. However, when an electrode material having a high degree of high acoustic impedance such as molybdenum (Mo) is used, electrical loss may be expected to increase as the thickness of the electrode decreases and electrical loss in the resonator and a filter device including the resonator may therefore be expected to increase.

However, when an electrode material having low acoustic impedance such as aluminum (Al) is used, since a mechanical property of aluminum (Al) is poor, mechanical dynamic loss is expected to be large and crystal orientation is deteriorated when the piezoelectric layer is formed.

That is, when the electrode material having high acoustic impedance such as molybdenum (Mo) is used, a thickness of each of an upper electrode and a lower electrode may be 1000 Å and a thickness of the piezoelectric layer may be 3000 Å, such that the operating frequency of 5 GHz may be implemented. However, when the electrode material having low acoustic impedance such as aluminum (Al) is used, even if the thickness of each of the upper electrode and the lower electrode is 2000 Å and the thickness of the piezoelectric layer is 4000 Å, the frequency of 5 GHz may be implemented.

However, in the case in which the upper electrode and the lower electrode are formed of aluminum (Al) only, mechanical properties may be deteriorated, while crystal orientation of the piezoelectric layer and performance of the resonator may be deteriorated due to an occurrence of a hillock by electromigration or mechanical deformation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: a substrate; a lower electrode disposed on the substrate; a piezoelectric layer disposed on the lower electrode; and an upper electrode disposed on the piezoelectric layer, wherein either one or both of the lower electrode and the upper electrode includes a layer of aluminum alloy including scandium (Sc).

Both of the lower electrode and the upper electrode may include the layer of aluminum alloy including scandium (Sc).

The upper electrode may further include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

The lower electrode may further include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

Only the lower electrode may include the layer of aluminum alloy including scandium (Sc), and the upper electrode may include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

The lower electrode may further include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

Only the upper electrode may include the layer of aluminum alloy including scandium (Sc), and the lower electrode may include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

The upper electrode may further include a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

A content of scandium (Sc) may be 0.1 to 5 at %.

The piezoelectric layer may include either one of aluminum nitride and doped aluminum nitride containing a rare earth metal.

The piezoelectric layer may include the doped aluminum nitride containing the rare earth metal, the doped aluminum nitride may include a dopant selected from the group including scandium, erbium, yttrium, lanthanum, and a metal including a combination of any two or more of scandium, erbium, yttrium, and lanthanum, and a content of the dopant may be 0.1 to 30 at %.

The bulk acoustic wave resonator may further include an etch stop portion disposed between the substrate and the lower electrode and disposed around a cavity.

The bulk acoustic wave resonator may further include an insertion layer disposed below a region of a portion of the piezoelectric layer.

A cavity may be formed in the substrate or on the substrate.

The upper electrode may include a frame portion disposed at an edge of an active area.

The bulk acoustic wave resonator may further include a reflective layer embedded in a groove in the substrate, or stacked on the substrate.

The reflective layer may include a first reflective member and a second reflective member disposed on the first reflective member, and the first and second reflective members may be formed as a pair or formed as a plurality of pairs in which the first and second reflective members are alternately disposed.

In another general aspect, a bulk acoustic wave resonator includes: a lower electrode disposed on a piezoelectric layer; and an upper electrode disposed on the piezoelectric layer, wherein either one or both of the lower electrode and the upper electrode is formed of a material having a lower acoustic impedance than molybdenum (Mo) and a mechanical strength greater than 35 MPa.

The material may have a higher chemical resistance than aluminum (Al).

The material may have a greater galvanic corrosion resistance than aluminum as determined in electrolytic solution in contact with gold.

The material may be a binary alloy.

The piezoelectric layer may consist essentially of crystals oriented <1.73° (0002) full width at half maximum (FWHM).

The material may consist essentially of crystals oriented <1.13° (111) full width at half maximum (FWHM).

The material may be formed of an aluminum alloy including scandium (Sc).

In another general aspect, a bulk acoustic wave resonator includes: a lower electrode including a first lower electrode layer disposed on a substrate, and a second lower electrode layer disposed on top of the first lower electrode layer; a piezoelectric layer disposed on top of the lower electrode; and an upper electrode disposed on top of the piezoelectric layer, wherein one of the first and second lower electrode layers is formed of an aluminum alloy including scandium (Sc), and the other of the first and second lower electrode layers is formed of a material other than the aluminum alloy including scandium (Sc).

A content of the scandium (Sc) in the aluminum alloy may be 0.1 to 5 at %.

The upper electrode may be formed of molybdenum (Mo).

The upper electrode may be formed of the aluminum alloy including scandium (Sc).

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
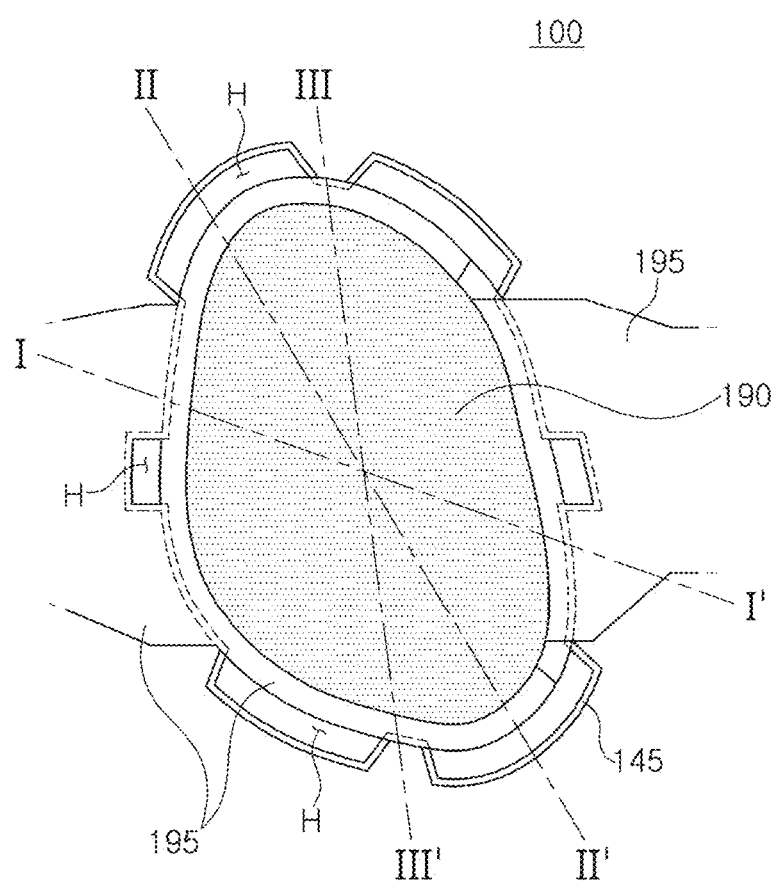
FIG. 1 is a plan view illustrating a bulk acoustic wave resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
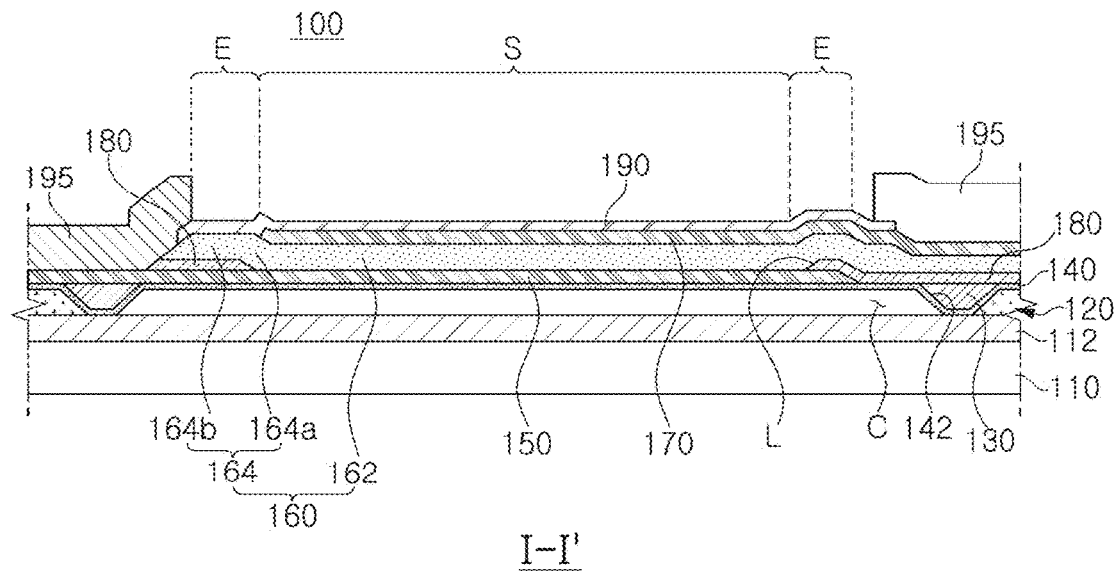
FIG. 2 is a cross-sectional view taken along a line I-I' of FIG. 1.
Figure 3:
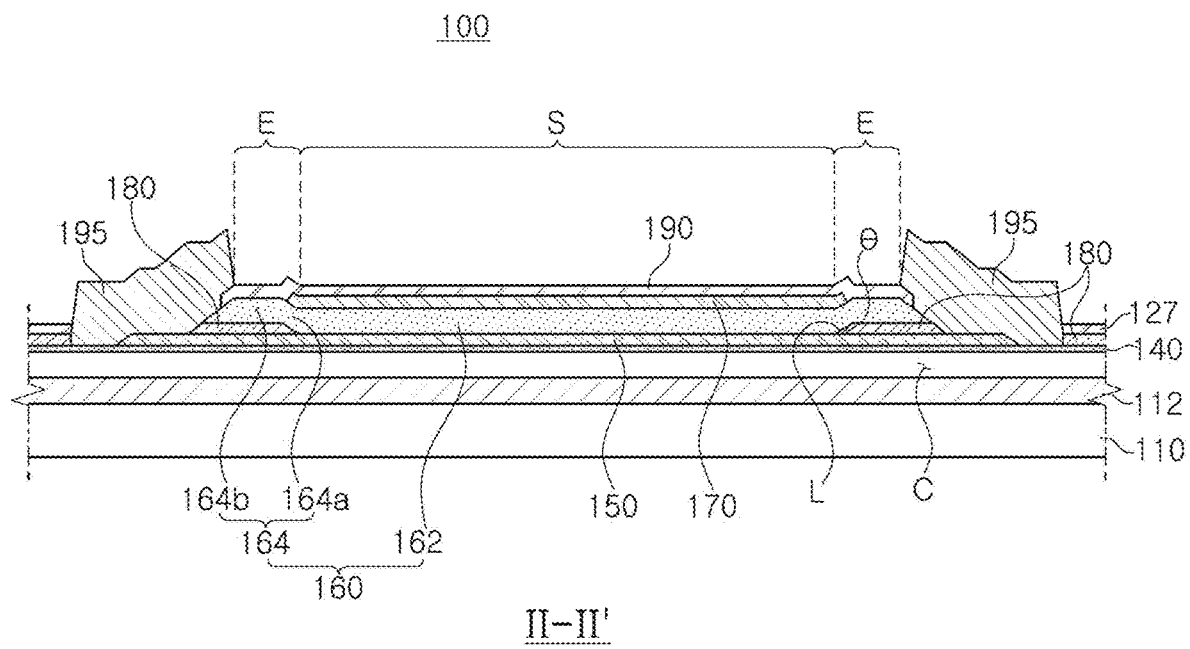
FIG. 3 is a cross-sectional view taken along a line II-II' of FIG. 1.
Figure 4:
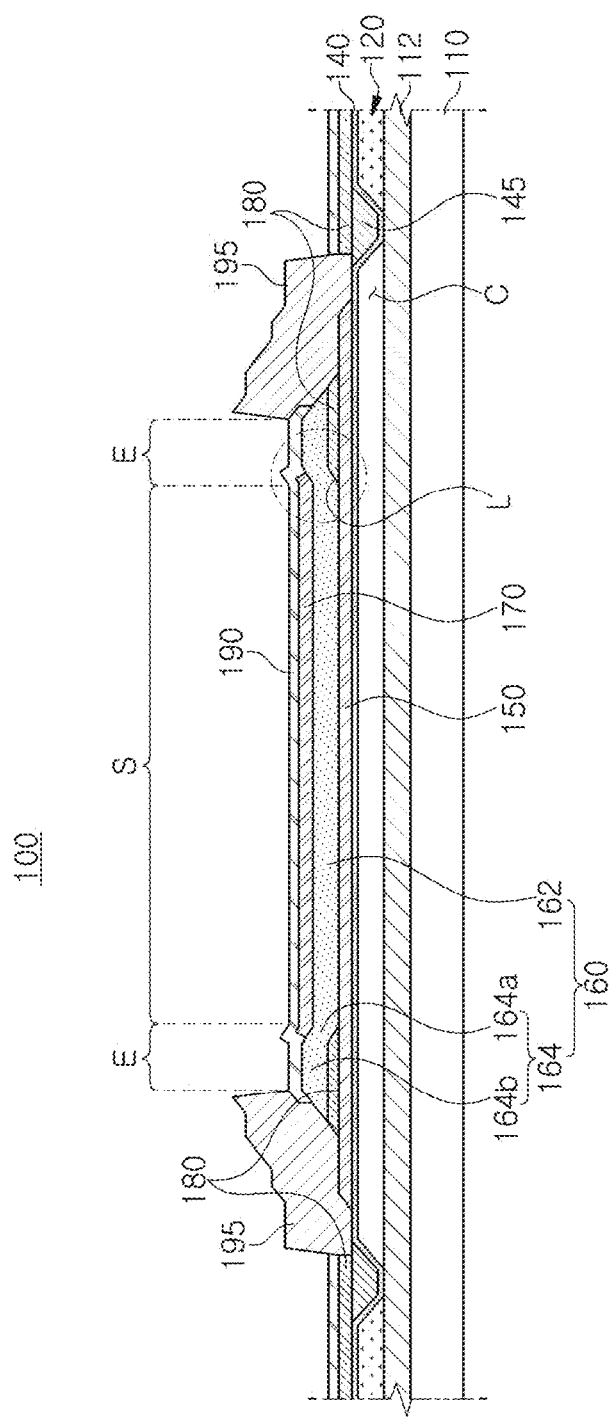
FIG. 4 is a cross-sectional view taken along a line III-III' of FIG. 1.

FIG. 1 is a plan view illustrating a bulk acoustic wave resonator 100, according to an embodiment. FIG. 2 is a cross-sectional view taken along a line I-I' of FIG. 1. FIG. 3 is a cross-sectional view taken along a line II-II' of FIG. 1. FIG. 4 is a cross-sectional view taken along a line III-III' FIG. 1.

Referring to FIGS. 1 through 4, the bulk acoustic wave resonator 100 may include a substrate 110, a sacrificial layer 120, an etch stop portion 130, a membrane layer 140, a lower electrode 150, a piezoelectric layer 160, an upper electrode 170, an insertion layer 180, a passivation layer 190, and a metal pad 195.

Referring to FIGS. 2 through 4, the substrate 110 may be a silicon substrate. For example, a silicon wafer or a silicon on insulator (SOI) type substrate may be used as the substrate 110.

An insulating layer 112 may be formed on an upper surface of the substrate 110 and may electrically isolate the substrate 110 from components disposed on the substrate 110. In addition, the insulating layer 112 may prevent the substrate 110 from being etched by etching gas when a cavity C is formed during a manufacturing process.

In this case, the insulating layer 112 may be formed of any one or any combination of any two or more of silicon dioxide ($SiO_2$), silicon nitride ($Si_3N_4$), aluminum oxide ($Al_2O_3$), and aluminum nitride (AlN). The insulating layer 112 may be formed by any one of a chemical vapor deposition process, an RF magnetron sputtering process, and an evaporation process.

The sacrificial layer 120 may be formed on the insulating layer 112, and the cavity C and the etch stop portion 130 may be disposed inside the sacrificial layer 120. The cavity C may be formed by removing a portion of the sacrificial layer 120 during the manufacturing process. As such, since the cavity C is formed inside the sacrificial layer 120, the lower electrode 150 or the like disposed on the sacrificial layer 120 may be formed to be flat.

Referring to FIG. 2, the etch stop portion 130 may be disposed along a boundary of the cavity C. The etch stop portion 130 may prevent the etching from being performed beyond a region of the cavity during a process of forming the cavity C.

The membrane layer 140 may form the cavity C together with the substrate 110. In addition, the membrane layer 140 may be formed of a material having low reactivity with etching gas when the sacrificial layer 120 is removed. Meanwhile, the etch stop portion 130 may be inserted into a groove part 142 formed by the membrane layer 140. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the membrane layer 140.

A seed layer (not shown) formed of aluminum nitride (AlN) may be formed on the membrane layer 140. That is, the seed layer may be disposed between the membrane layer 140 and the lower electrode 150. The seed layer may be formed of a dielectric or a metal other than aluminum nitride (AlN) having a hexagonal close-packed (HCP) crystal structure. As an example, in a case in which the seed layer is formed of the metal, the seed layer may be formed of titanium (Ti).

The lower electrode 150 may be formed on the membrane layer 140, and a portion of the lower electrode 150 may be disposed on the cavity C. In addition, the lower electrode 150 may be used as either one of an input electrode that inputs an electrical signal such as a radio frequency (RF) signal or the like, and an output electrode that outputs an electrical signal such as an RF signal or the like.

The lower electrode 150 may be formed of an aluminum alloy including scandium (Sc), for example. The lower electrode 150 be may formed of the aluminum alloy including scandium (Sc), such that high power reactive sputtering may be increased with an increase in mechanical strength. Under such a high power reactive sputtering condition, an increase in surface roughness of the lower electrode 150 may be prevented and high orientation growth of the piezoelectric layer 160 may also be induced.

In addition, since the lower electrode 150 contains scandium (Sc), chemical resistance of the lower electrode 150 may be increased, which may reduce or eliminate a disadvantage caused when the lower electrode is formed of pure aluminum. Further, during the manufacturing process, stability of a process such as dry etching or wet etching may be provided. Further, oxidation is easily caused in the case in which a lower electrode is formed of pure aluminum. However, since the lower electrode 150 is formed of the aluminum alloy including scandium, chemical resistance against oxidation may be increased.

In a comparison, an electrode was formed of molybdenum so as to have a thickness of 1500 Å, another electrode was formed of an aluminum alloy (AlSc) containing scandium of 0.625 at % so as to have a thickness of 1500 Å, and sheet resistance of the electrodes was measured. The electrode formed of molybdenum (Mo) had a sheet resistance of 0.9685 ohm/□, while the electrode formed of the aluminum alloy (AlSc) containing scandium of 0.625 at % had a sheet resistance of 0.316 ohm/□. As such, it can be seen that the sheet resistance was decreased in the electrode formed of the material of aluminum alloy (AlSc) as compared to the electrode formed of the material of molybdenum (Mo).

The content of scandium (Sc) in an AlSc alloy for an electrode may be 0.1 at % to 5 at %. That is, in a case in which the content of scandium (Sc) is less than 0.1 at %, deterioration of mechanical property and hillock caused by aluminum (Al) may occur, and in a case in which the content of scandium (Sc) is 5 at % or more, it is difficult to improve electrical loss representing the sheet resistance. In addition, in a case in which the content of scandium (Sc) is increased, surface roughness is increased, which may adversely affect the crystal orientation of the piezoelectric layer.

TABLE 1

| Material | Yield strength | Elongation |
|---|---|---|
| Pure Al | 35 Mpa | 45% |
| AlSc (Sc 0.625 at %) | 300 Mpa | 15% |

In addition, as illustrated in Table 1 above, it can be seen that the material of aluminum alloy (AlSc, 0.625 at %) containing scandium has increased yield strength and reduced elongation as compared to pure aluminum (Al).

Figure 5:
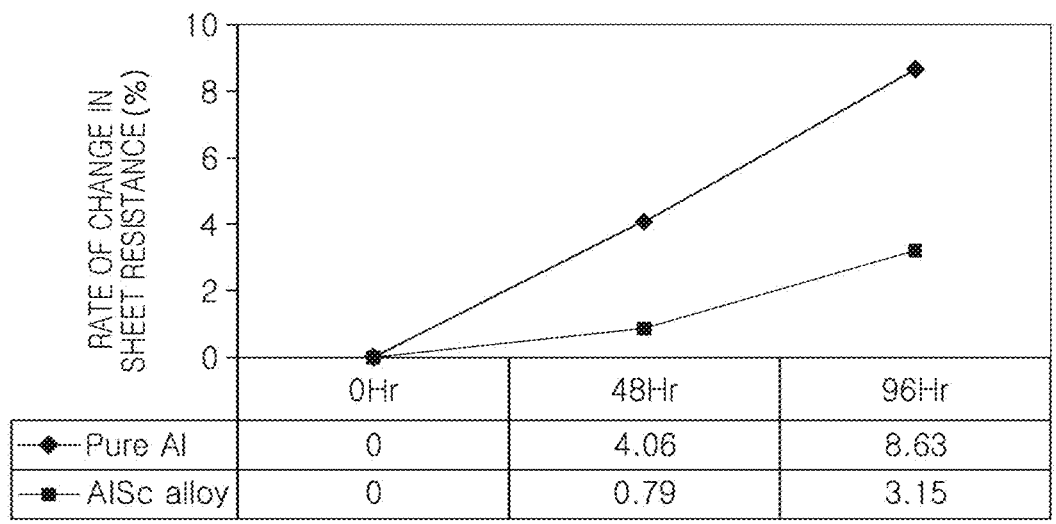
FIG. 5 is a graph illustrating a rate of change in sheet resistance of an aluminum alloy including pure aluminum and scandium.

In addition, as illustrated in FIG. 5, the pure aluminum (Al) and the material of aluminum alloy (AlSc, 0.625 at %) containing scandium (Sc) were each deposited to have a thickness of 1500 Å and a change in sheet resistance was measured in a reliable environment. As a result, comparing a rate of change in sheet resistance after 96 Hr, the material of aluminum alloy (AlSc, 0.625 at %) containing scandium exhibited a rate of change in sheet resistance of about 50% of the rate of change in sheet resistance of the pure aluminum (Al). Therefore, it can be seen that an oxidation resistance characteristic of the aluminum alloy including scandium is excellent.

In addition, the lower electrode 150 has an excellent galvanic corrosion characteristic with the metal pad 195, so that stability in the manufacturing process may be obtained. For example, the pure aluminum (Al) and the material of aluminum alloy (AlSc, 0.625 at %) containing scandium were deposited to have the thickness of 1500 Å, then contacted with gold (Au), which is mainly used as a material of the metal pad 195, and then immersed in an electrolyte solution for 65 hours to compare galvanic corrosion characteristics. As a result, a change in a surface was not observed in the material of aluminum alloy (AlSc, 0.625 at %) containing scandium, but corrosion with gold (Au) was observed in the pure aluminum. Therefore, when the lower electrode 150 is formed of aluminum alloy (AlSc) containing scandium, excellent characteristics for galvanic corrosion may be provided in the manufacturing process.

The lower electrode 150 may be formed of aluminum alloy (AlSc) containing only aluminum and scandium (Sc). That is, additional metals, except for aluminum scandium (Sc), are not contained. If metals in addition to scandium (Sc) are included with the aluminum, such an aluminum alloy may form a ternary system in a phase diagram. In this case, it is difficult to control a combination, and by having a complicated phase system, composition unevenness and an undesired crystal phase may be formed.

Further, in a case in which the lower electrode 150 is formed of the aluminum alloy formed in the ternary system, surface roughness is increased due to the formation of composition unevenness and the undesired crystal phase, which may adversely affect crystal orientation when the piezoelectric layer 160 is formed.

Therefore, since the lower electrode 150 is formed of aluminum alloy (AlSc) containing only scandium (Sc), crystal orientation of the piezoelectric layer 160 disposed on the lower electrode 150 may be improved. A detailed description of such an improved crystal orientation will be provided below.

The piezoelectric layer 160 may be formed to at least cover the lower electrode 150 disposed on the cavity C. The piezoelectric layer 160, which is a portion that generates a piezoelectric effect that converts electric energy into mechanical energy in a form of an elastic wave, may be formed of either one of aluminum nitride (AlN), zinc oxide (ZnO), and lead zirconium titanium oxide (PZT; PbZrTiO). In particular, in a case in which the piezoelectric layer 160 is formed of aluminum nitride (AlN), the piezoelectric layer 160 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). In addition, the transition metal may also include magnesium (Mg), which is a divalent metal.

In addition, the content of elements included in aluminum nitride (AlN) to improve piezoelectric characteristic may be 0.1 to 30 at %. If the amount of elements included to improve piezoelectric characteristic is less than 0.1 at %, a piezoelectric characteristic higher than that of aluminum nitride (AlN) may not be implemented, and if the content of elements included to improve piezoelectric characteristic exceeds 30 at %, it may be difficult to implement manufacturing for deposition and composition control, and a non-uniform phase may be thus formed.

The piezoelectric layer 160 may include a piezoelectric portion 162 disposed in a substantially straight, central portion S and a bending portion 164 disposed in the extending portion E.

Referring to FIGS. 2 to 4, the piezoelectric portion 162 may be a portion directly stacked on the upper surface of the lower electrode 150. Therefore, the piezoelectric portion 162 may be interposed between the lower electrode 150 and the upper electrode 170 to form a flat shape together with the lower electrode 150 and the upper electrode 170.

The bending portion 164 may be defined as a region extended externally from the piezoelectric portion 162 and disposed in the extending portion E.

The bending portion 164 may be disposed on the insertion layer 180 to be described below, and may be formed to be uplifted along a shape of the insertion layer 180. Accordingly, the piezoelectric layer 160 may be bent at a boundary between the piezoelectric portion 162 and the bending portion 164, and the bending portion 164 may be raised, or uplifted to correspond to a thickness and a shape of the insertion layer 180.

The bending portion 164 may include an inclined portion 164a and an extended portion 164b.

The inclined portion 164a is a portion inclined along an inclined surface L of the insertion layer 180 to be described below. In addition, the extended portion 164b is a portion extended externally from the inclined portion 164a.

The inclined portion 164a may be formed to be parallel to the inclined surface L of the insertion layer 180, and an incline angle of the inclined portion 164a may be the same as an incline angle (θ in FIG. 3) of the inclined surface L of the insertion layer 180.

The upper electrode 170 may be formed to at least cover a portion of the piezoelectric layer 160 disposed on the cavity C. The upper electrode 170 may be used as any one of an input electrode and an output electrode that inputs or outputs an electrical signal such as a radio frequency (RF) signal, or the like. That is, in a case in which the lower electrode 150 is used as the input electrode, the upper electrode 170 may be used as the output electrode, and in a case in which the lower electrode 150 is used as the output electrode, the upper electrode 170 may be used as the input electrode.

The upper electrode 170 may also be formed of an aluminum alloy including scandium (Sc), similarly to the lower electrode 150.

The insertion layer 180 may be disposed between the lower electrode 150 and the piezoelectric layer 160. The insertion layer 180 may be formed of a dielectric such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the piezoelectric layer 160. In addition, a region in which the insertion layer 180 is formed may also be formed as an air space, as needed. This may be implemented by removing the insertion layer 180 during the manufacturing process.

According to the embodiment of FIGS. 2 to 4, a thickness of the insertion layer 180 may be the same as or similar to a thickness of the lower electrode 150. In addition, the thickness of the insertion layer 180 may be similar to or less than the thickness of the piezoelectric layer 160. For example, the insertion layer 180 may have a thickness of 100 Å or more, and may have a thickness less than the thickness of the piezoelectric layer 160. However, the configuration of the insertion layer 180, the lower electrode 150, and the piezoelectric layer 160 is not limited to the foregoing description.

Meanwhile, the insertion layer 180 may be disposed along a surface formed by the membrane layer 140, the lower electrode 150, and the etch stop portion 130.

The insertion layer 180 may be disposed around the substantially straight portion S to support the bending portion 164 of the piezoelectric layer 160. Therefore, the bending portion 164 of the piezoelectric layer 160 may be configured to include the inclined portion 164a and the extended portion 164b depending on the shape of the insertion layer 180.

The insertion layer 180 may be disposed in a region other than the substantially straight portion S. For example, the insertion layer 180 may be disposed in the entire region other than the substantially straight portion S or in a portion of a region other than the substantially straight portion S.

In addition, at least a portion of the insertion layer 180 may be disposed between the piezoelectric layer 160 and the lower electrode 150.

A side surface of the insertion layer 180 disposed along a boundary of the substantially straight portion S may have a thickness that increases as a distance from the substantially straight portion S is increases. Thereby, the side surface of the insertion layer 180 disposed adjacent to the substantially straight portion S may be formed as the inclined surface L having a constant incline angle θ.

In a case in which the incline angle θ of the side surface of the insertion layer 180 is less than 5°, it is difficult to manufacture the insertion layer 180 because the thickness of the insertion layer 180 needs to be extremely thin or an area of the inclined surface L needs to be excessively large.

In addition, in a case in which the incline angle θ of the side surface of the insertion layer 180 is greater than 70°, the incline angle of the inclined portion 164a of the piezoelectric layer 160 stacked on the insertion layer 180 may also be greater than 70°. In this case, since the piezoelectric layer 160 is bent excessively, a crack may occur in a bent portion of the piezoelectric layer 160.

Therefore, according to the embodiment of FIGS. 2 to 4, the incline angle θ of the inclined surface L may be in the range of 5° to 70°.

The passivation layer 190 may be formed on the lower electrode 150 and a region excluding a portion of the upper electrode 170. The passivation layer 190 may prevent damage to the upper electrode 170 and the lower electrode 150 during a process of manufacturing the bulk acoustic wave resonator 100.

Further, a portion of the passivation layer 190 may be removed by etching for frequency control in a final process. That is, a thickness of the passivation layer 190 may be controlled. As the passivation layer 190, for example, a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used.

The metal pad 195 may be formed on the lower electrode 150 and the portion of the upper electrode 170 on which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

As described above, since the lower electrode 150 and the upper electrode 170 are formed of the aluminum alloy including scandium (Sc), electrical loss may be improved.

Further, since mechanical strength may be improved, the piezoelectric layer 160 may be more stably deposited during the sputtering process to thereby improve crystal orientation, and chemical resistance may be improved to ensure manufacturing stability.

In more detail, when aluminum alloy (AlSc) containing pure aluminum (Al) and scandium (Sc) is deposited to have a thickness of 1500 Å on a seed layer having a thickness of 500 Å and formed of an aluminum nitride (AlN), and surface defect of the deposited aluminum alloy (AlSc) is then observed, defects due to a hillock and a grain boundary groove are significantly reduced in comparison with pure aluminum (Al).

Figure 6:
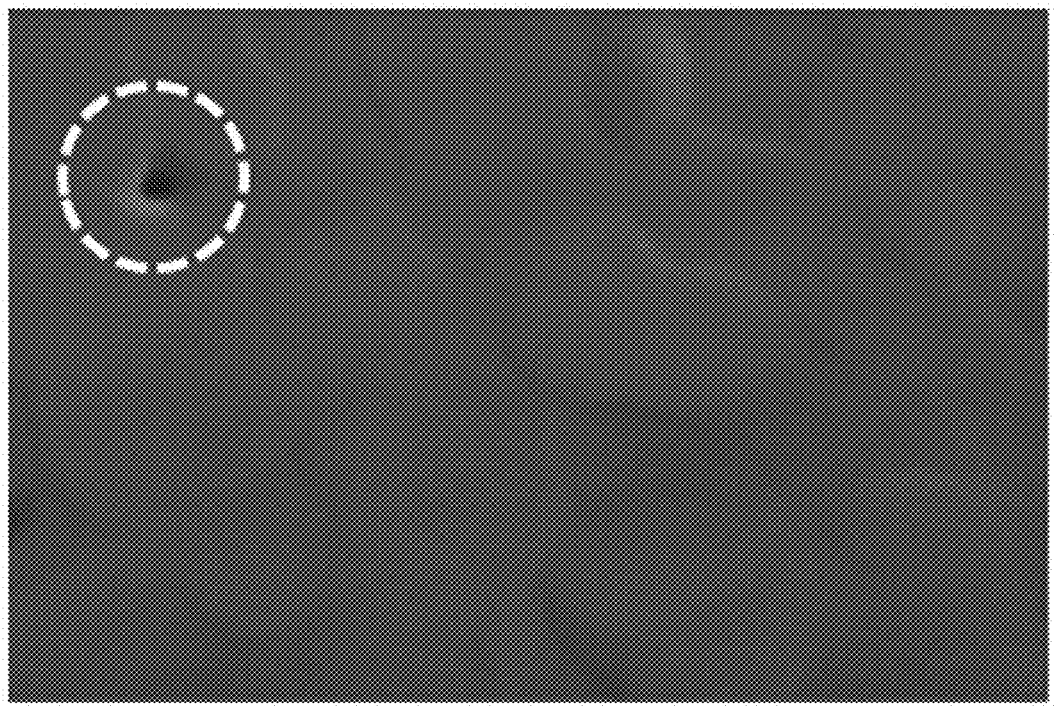
FIG. 6 is a photograph illustrating surface defects of pure aluminum.
Figure 7:
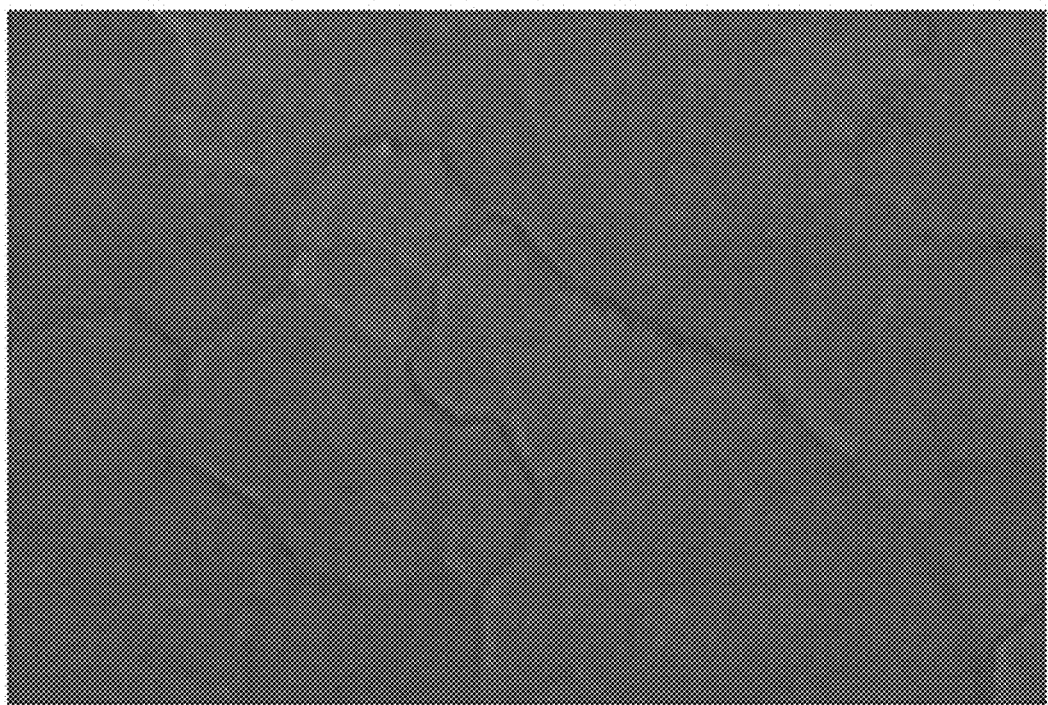
FIG. 7 is a photograph illustrating surface defects of a scandium-containing aluminum alloy (0.625 at %).
Figure 8:
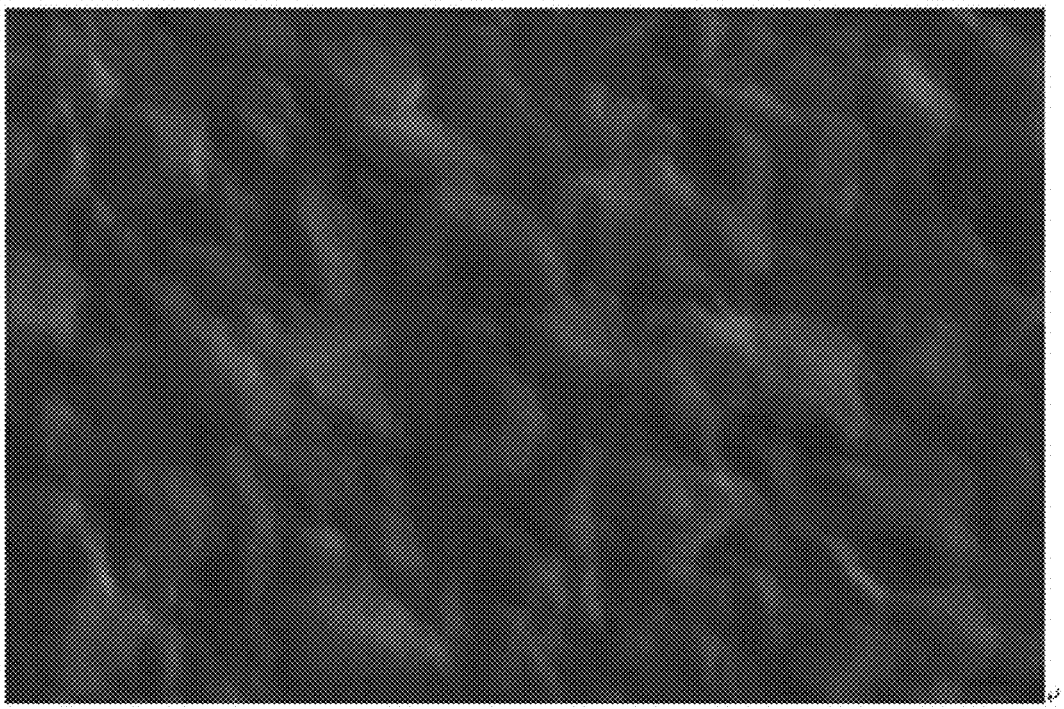
FIG. 8 is a photograph illustrating surface defects of a scandium-containing aluminum alloy (6.25 at %).

That is, as illustrated in FIGS. 6 and 7, the surface defects of a groove are observed in pure aluminum (Al), but the surface defects are not observed in the aluminum alloy (AlSc, 0.625 at %) containing scandium (Sc). In addition, as illustrated in FIG. 8, when the content of scandium (Sc) is excessive, it can be seen that surface roughness is increased.

Figure 9:
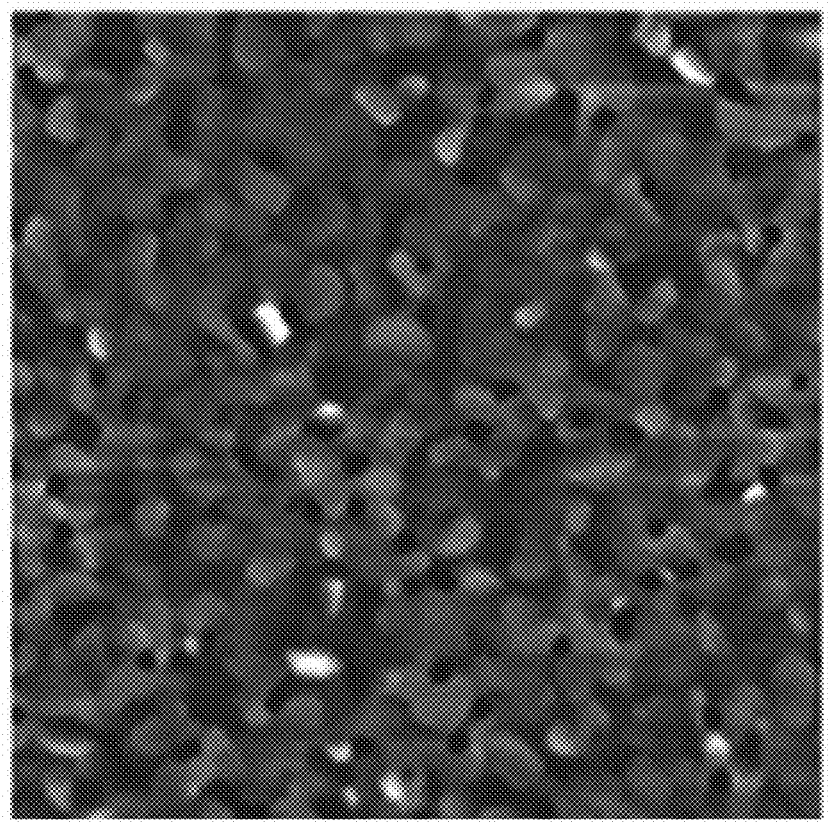
FIG. 9 is a photograph illustrating surface roughness of pure aluminum by an atomic force microscopy.
Figure 10:
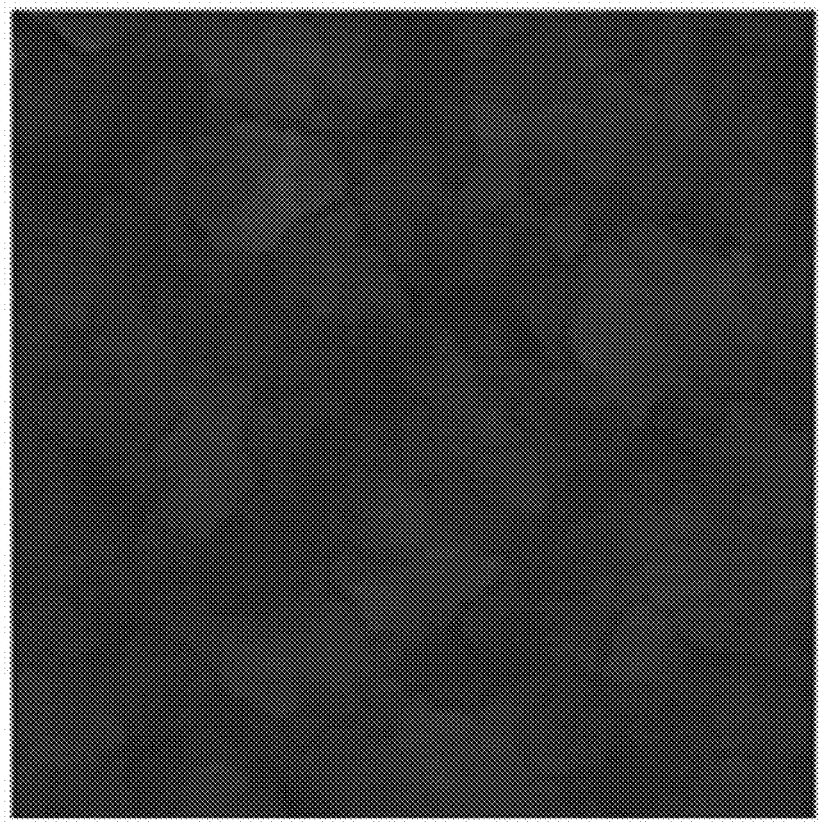
FIG. 10 is a photograph illustrating surface roughness of a scandium-containing aluminum alloy (0.625 at %) by an atomic force microscopy.
Figure 11:
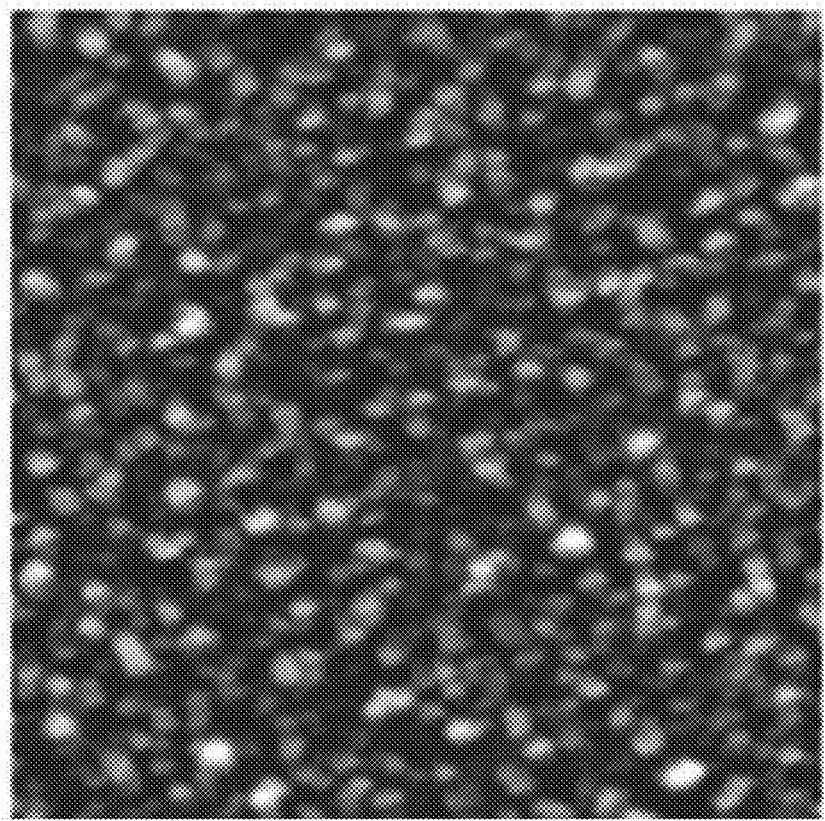
FIG. 11 is a photograph illustrating surface roughness of a scandium-containing aluminum alloy (6.25 at %) by an atomic force microscopy.

In more detail, a surface roughness of samples in which pure aluminum (Al) (FIG. 6), aluminum alloy (AlSc) containing scandium (Sc) of 0.625 at % (FIG. 7), and aluminum alloy (AlSc) containing scandium (Sc) of 6.25 at % (FIG. 8) were deposited was measured by an atomic force microscopy (AFM). As a result, as illustrated in FIG. 9, pure aluminum (Al) had a surface roughness of 3.74 nm based on a scan size (10 μm×10 μm), and, as illustrated in FIG. 10, aluminum alloy (AlSc) containing scandium (Sc) of 0.625 at % had a surface roughness of 1.70 nm based on a scan size (10 μm×10 μm). In addition, as illustrated in FIG. 11, aluminum alloy (AlSc) containing scandium (Sc) of 6.25 at % had surface roughness (Ra) increased to 10.27 nm based on a scan size of (10 μm×10 μm).

Aluminum alloy (AlSc) containing pure aluminum (Al) and scandium (Sc) may have a FCC crystal structure, and when aluminum alloy is oriented in a (111) crystal surface, it has lattice mismatch of 8% with a (0002) crystal surface of a HCP crystal structure of aluminum nitride (AlN), which forms the piezoelectric layer 160. The lower electrode 150 formed of the aluminum alloy (AlSc) containing pure aluminum (Al) and scandium (Sc) has an improved lattice mismatch with aluminum nitride (AlN), as compared to a lattice mismatch of 14% in a case in which a lower electrode is formed of molybdenum (Mo).

However, in the case of a pure aluminum (Al) lower electrode, when surface roughness is increased, crystal orientation of the piezoelectric layer 160 may be deteriorated due to surface defects, and the like.

In an example comparison, aluminum alloy (AlSc) containing pure aluminum (Al) and scandium (Sc), pure aluminum (Al), and molybdenum (Mo) were each deposited to have a thickness of 1500 Å on a seed layer having the thickness of 500 Å and formed of aluminum nitride (AlN), and aluminum nitride (AlN), forming the piezoelectric layer 160, was then deposited to have the thickness of 5000 Å. An XRD rocking curve was measured to compare crystal orientation of the resulting thin film in each case. The resulting crystal orientations are shown as in Table 2 below.

TABLE 2

| full width at half maximum (FWHM) (degree) | Molybdenum (Mo) | Pure Aluminum (Al) | Aluminum alloy including scandium (AlSc, 6.25 at %) | Aluminum alloy including scandium (AlSc, 0.625 at %) |
|---|---|---|---|---|
| Crystal Orientation of Lower Electrode (1500 Å) | 2.77° (110) | 1.31° (111) | 1.13° (111) | 0.49° (111) |
| Crystal Orientation of Piezoelectric Layer (5000 Å) | 1.95° (0002) | 1.73° (0002) | 2.19° (0002) | 0.78° (0002) |

Figure 12:
FIG. 12 is a photograph illustrating surface defects of a piezoelectric layer formed on pure aluminum.
Figure 13:
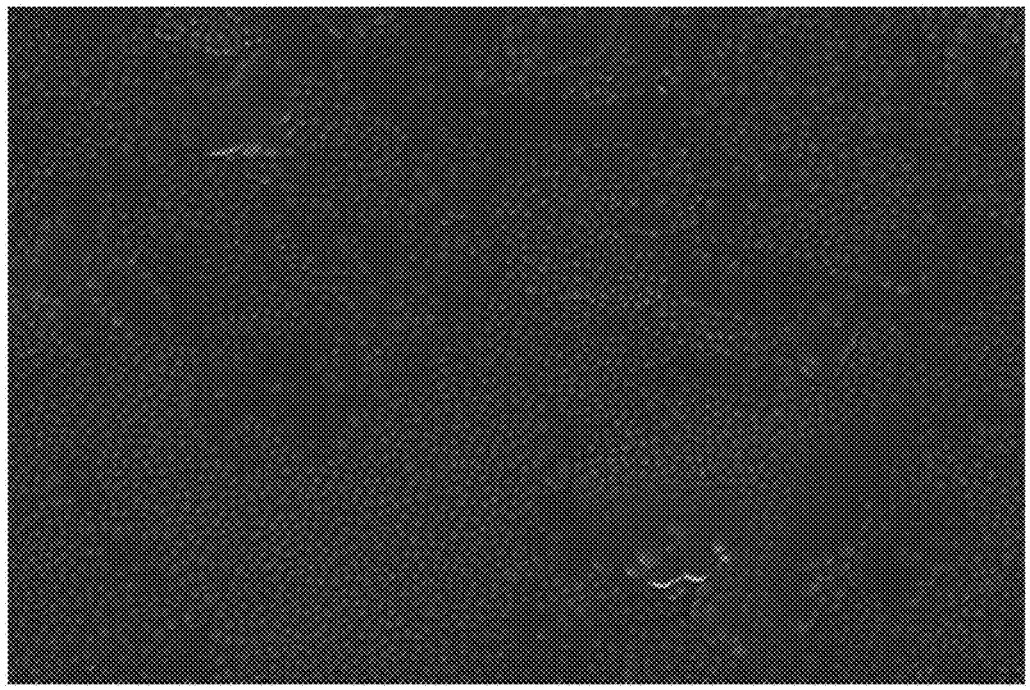
FIG. 13 is a photograph illustrating surface defects of a piezoelectric layer formed on a scandium-containing aluminum alloy (6.25 at %).
Figure 14:
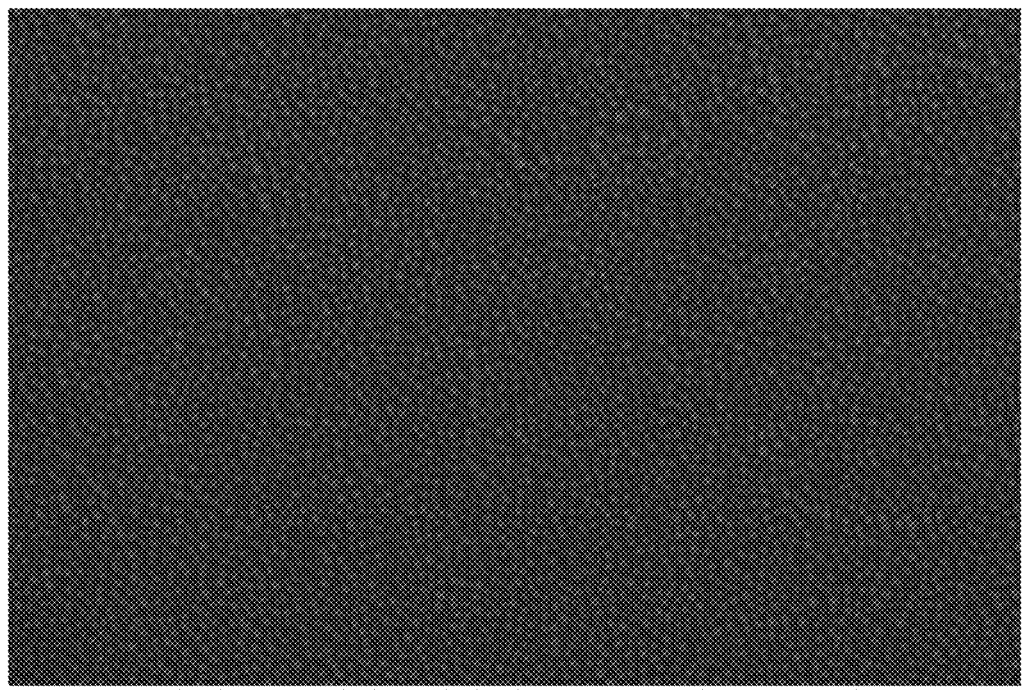
FIG. 14 is a photograph illustrating surface defects of a piezoelectric layer formed on a scandium-containing aluminum alloy (0.625 at %).

That is, in a case in which aluminum nitride (AlN) was deposited on molybdenum (Mo), the crystal orientation of aluminum nitride (AlN) was 1.95°, and in a case in which aluminum nitride (AlN) was deposited on pure aluminum (Al), crystal orientation was 1.73° (see Table 2) due to surface defects of the pure aluminum (Al). In other words, crystal orientation of the piezoelectric layer deposited on pure aluminum (Al) was improved as compared to the case to which the piezoelectric layer was deposited on molybdenum (Mo), but the surface defects of the groove observed on the surface of pure aluminum (Al) are transferred as it is, even in the case in which aluminum nitride (AlN) is deposited as illustrated in FIG. 12. In addition, crystal orientation of the piezoelectric layer deposited on aluminum alloy (AlSc) containing scandium of 6.25 at % was deteriorated to 2.19° (see Table 2) as compared to the piezoelectric layer deposited on pure aluminum (Al), due to an increase in surface roughness when aluminum nitride (AlN) is deposited, as illustrated in FIG. 13. However, aluminum nitride (AlN) deposited on aluminum alloy (AlSc) containing scandium (Sc) of 0.625 at % exhibited an excellent crystal orientation of 0.78° (see Table 2), as illustrated in FIG. 14.

In other words, when the lower electrode 150 is formed of the aluminum alloy (AlSc) containing scandium (Sc) of 0.625 at %, the piezoelectric layer 160 may be more stably deposited on the lower electrode 150 during the sputtering process to thereby improve crystal orientation, and chemical resistance may be improved to provide manufacturing stability.

Hereinafter, modified examples of a bulk acoustic wave resonator will be described with reference to the accompanying drawings. However, the same components as the above-mentioned components will be indicated by the same reference numerals, and a detailed description thereof will be omitted.

Figure 15:
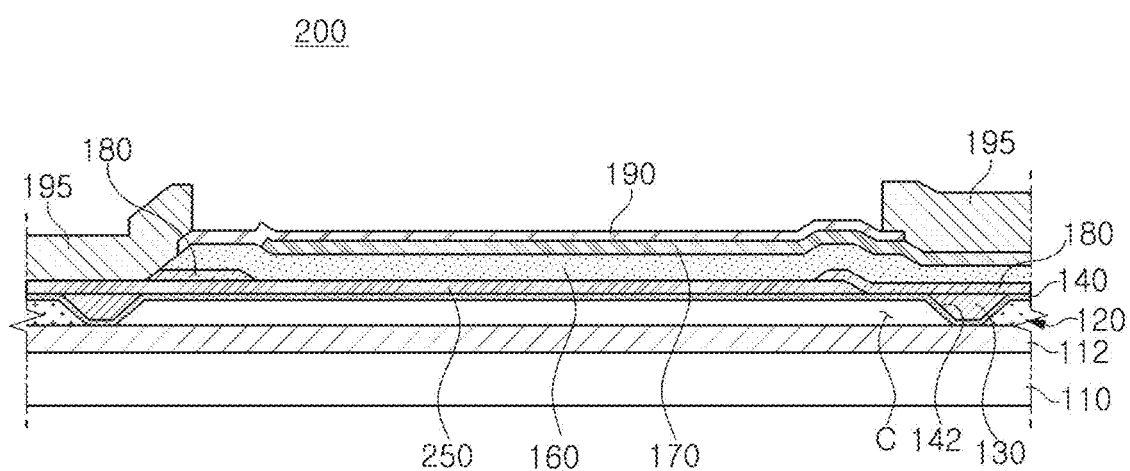
FIG. 15 is a schematic cross-sectional view illustrating a bulk acoustic wave resonator, according to another embodiment.

FIG. 15 is a schematic cross-sectional view illustrating a bulk acoustic wave resonator 200, according to another embodiment.

Referring to FIG. 15, the bulk acoustic wave resonator 200 may include the substrate 110, the sacrificial layer 120, the etch stop portion 130, the membrane layer 140, a lower electrode 250, the piezoelectric layer 160, the upper electrode 170, the insertion layer 180, the passivation layer 190, and the metal pad 195.

The lower electrode 250 may be formed on the membrane layer 140, and a portion of the lower electrode 250 may be disposed on the cavity C. In addition, the lower electrode 250 may be used as either one of an input electrode and an output electrode that inputs or outputs an electrical signal such as a radio frequency (RF) signal or the like.

The lower electrode 250 may be formed of, for example, a conductive material such as molybdenum (Mo) or an alloy thereof. However, the material of the lower electrode 250 is not limited to molybdenum (Mo), and the lower electrode 250 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Since the upper electrode 170 is formed of the aluminum alloy including scandium (Sc), chemical resistance may be increased. That is, a disadvantage caused when the upper electrode is formed of the pure aluminum may be reduced or eliminated. Further, during the manufacturing process, stability of a process such as dry etching or wet etching may be provided. Further, in the case in which the lower electrode is formed of pure aluminum, oxidation is easily caused, but since the upper electrode 170 is formed of the aluminum alloy including scandium, chemical resistance against oxidation may be increased.

Figure 16:
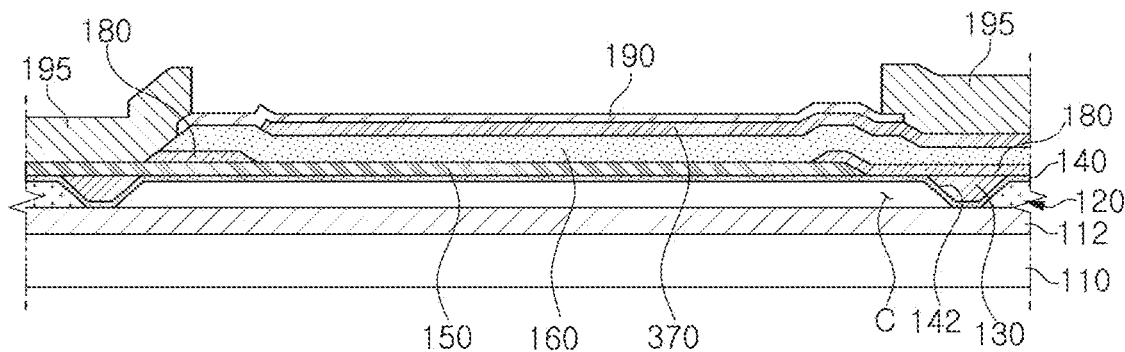
FIG. 16 is a schematic cross-sectional view illustrating a bulk acoustic wave resonator, according to another embodiment.

FIG. 16 is a schematic cross-sectional view illustrating a bulk acoustic wave resonator 300, according to another embodiment.

Referring to FIG. 16, the bulk acoustic wave resonator 300 may include the substrate 110, the sacrificial layer 120, the etch stop portion 130, the membrane layer 140, the lower electrode 150, the piezoelectric layer 160, an upper electrode 370, the insertion layer 180, the passivation layer 190, and the metal pad 195.

The upper electrode 370 may be formed to at least cover a portion of the piezoelectric layer 160 disposed on the cavity C. The upper electrode 370 may be used as either one of an input electrode and an output electrode that inputs and outputs an electrical signal such as a radio frequency (RF) signal, or the like. That is, in a case in which the lower electrode 150 is used as the input electrode, the upper electrode 370 may be used as the output electrode, and in a case in which the lower electrode 150 is used as the output electrode, the upper electrode 370 may be used as the input electrode.

The upper electrode 370 may be formed of a conductive material such as molybdenum (Mo) or an alloy thereof. However, the material of the upper electrode 370 is not limited to molybdenum (Mo), and the upper electrode 370 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The lower electrode 150 may be formed of the aluminum alloy including scandium (Sc) As such, high power reactive sputtering may be increased with an increase in mechanical strength. In addition, under such a deposition condition, an increase in surface roughness of the lower electrode 150 may be prevented and high orientation growth of the piezoelectric layer 160 may also be induced.

In addition, since scandium (Sc) is contained in the lower electrode 150, chemical resistance of the lower electrode 150 may be increased, which may thus reduce or eliminate a disadvantage caused when the lower electrode is formed of pure aluminum. Further, during the manufacturing process, stability of a process such as dry etching or wet etching may be provided. Further, in the case in which the lower electrode is formed of pure aluminum, oxidation is easily caused, but since the lower electrode 150 is formed of the aluminum alloy including scandium, chemical resistance against oxidation may be increased.

Figure 17:
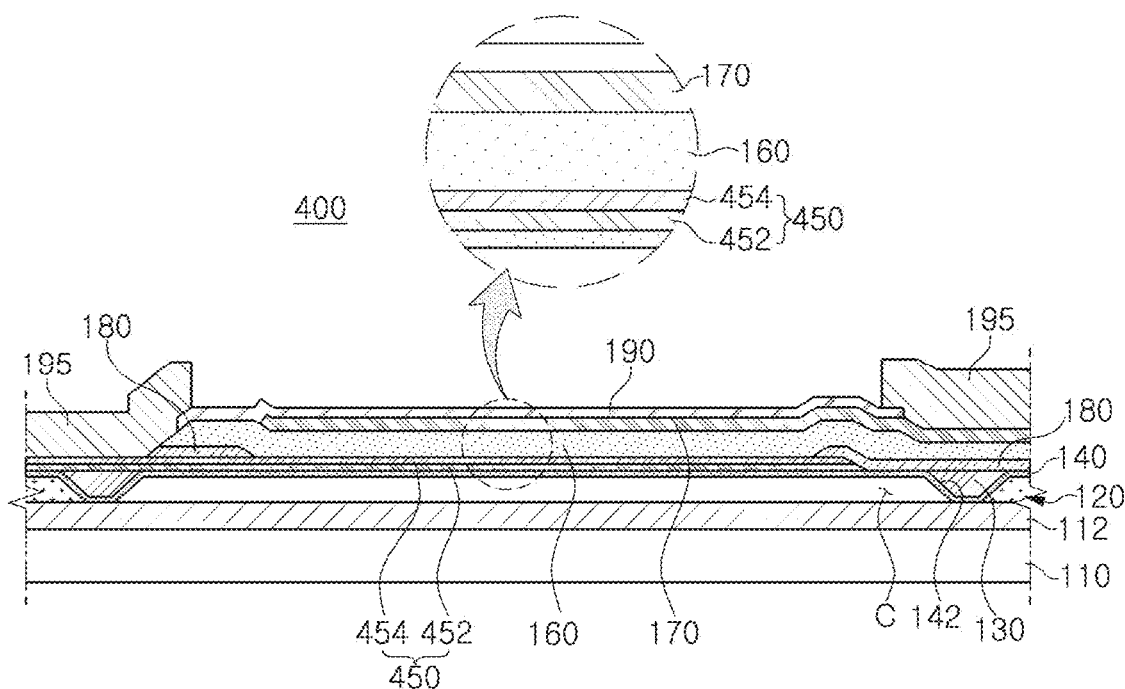
FIG. 17 is a schematic cross-sectional view illustrating a bulk acoustic wave resonator, according to another embodiment.

FIG. 17 is a schematic cross-sectional view illustrating a bulk acoustic wave resonator 400, according to another embodiment.

Referring to FIG. 17, the bulk acoustic wave resonator 400 may include the substrate 110, the sacrificial layer 120, the etch stop portion 130, the membrane layer 140, a lower electrode 450, the piezoelectric layer 160, the upper electrode 170, the insertion layer 180, the passivation layer 190, and the metal pad 195.

The lower electrode 450 may be formed on the membrane layer 140, and a portion of the lower electrode 450 may be disposed on the cavity C. In addition, the lower electrode 450 may be used as either one of an input electrode and an output electrode that inputs or outputs an electrical signal such as a radio frequency (RF) signal or the like.

As an example, the lower electrode 450 may include a first lower electrode layer 452 formed of an aluminum alloy including scandium (Sc), and a second lower electrode layer 454 formed on the first lower electrode layer 452.

The second lower electrode layer 454 may be formed of, for example, a conductive material such as molybdenum (Mo) or an alloy thereof. However, the material of the second lower electrode layer 454 is not limited to molybdenum (Mo), and the second lower electrode layer 454 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

As described above, since the upper electrode 170 and the first lower electrode layer 452 are formed of the aluminum alloy including scandium (Sc), chemical resistance is increased, which may thus reduce or eliminate a disadvantage caused when the lower electrode and the upper electrode are formed of pure aluminum. Further, during the manufacturing process, stability of a process such as dry etching or wet etching may be provided. Further, in the case in which the lower electrode and the upper electrode are formed of pure aluminum, oxidation is easily caused, but since the upper electrode 170 and lower electrode 450 are formed of the aluminum alloy including scandium, chemical resistance against oxidation may be increased.

Figure 18:
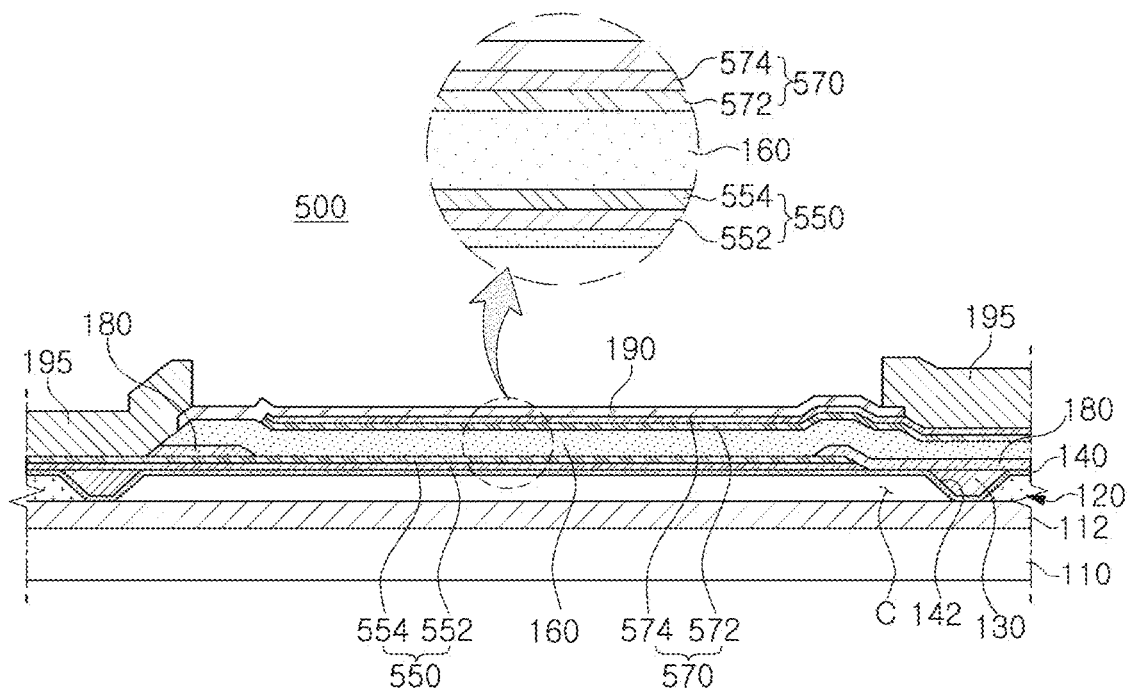
FIG. 18 is a schematic cross-sectional view illustrating a bulk acoustic wave resonator, according to another embodiment.

FIG. 18 is a schematic cross-sectional view illustrating a bulk acoustic wave resonator 500, according to another embodiment.

Referring to FIG. 18, the bulk acoustic wave resonator 500 may include the substrate 110, the sacrificial layer 120, the etch stop portion 130, the membrane layer 140, a lower electrode 550, the piezoelectric layer 160, an upper electrode 570, the insertion layer 180, the passivation layer 190, and the metal pad 195.

The lower electrode 550 may be formed on the membrane layer 140, and a portion of the lower electrode 550 may be disposed on the cavity C. In addition, the lower electrode 550 may be used as either one of an input electrode and an output electrode that inputs or outputs an electrical signal such as a radio frequency (RF) signal or the like.

As an example, the lower electrode 550 may include a first lower electrode layer 552, and a second lower electrode layer 554 formed on the first lower electrode layer 552 and formed of an aluminum alloy including scandium (Sc).

The first lower electrode layer 552 may be formed of, for example, a conductive material such as molybdenum (Mo) or an alloy thereof. However, the material of the first lower electrode layer 552 is not limited to molybdenum (Mo), and the first lower electrode layer 552 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 570 may be formed to at least cover a portion of the piezoelectric layer 160 disposed on the cavity C. The upper electrode 570 may be used as either one of an input electrode and an output electrode that inputs or outputs an electrical signal such as a radio frequency (RF) signal, or the like. That is, in a case in which the lower electrode 550 is used as the input electrode, the upper electrode 570 may be used as the output electrode, and in a case in which the lower electrode 550 is used as the output electrode, the upper electrode 570 may be used as the input electrode.

The upper electrode 570 may include a first upper electrode layer 572 formed of an aluminum alloy including scandium (Sc), and a second upper electrode layer 574 formed on the first upper electrode layer 572.

In addition, the second upper electrode layer 574 may be formed of a conductive material such as molybdenum (Mo) or an alloy thereof. However, the material of the second upper electrode layer 574 is not limited to molybdenum (Mo), and the second upper electrode layer 574 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

As described above, the second lower electrode layer 554 is formed of the aluminum alloy including scandium Sc. As such, the second lower electrode layer 554 is formed of the aluminum alloy including scandium (Sc), such that high power reactive sputtering may be increased with an increase in mechanical strength. In addition, under such a deposition condition, an increase in surface roughness of the second lower electrode layer 554 may be prevented and high orientation growth of the piezoelectric layer 160 may also be induced.

In addition, since the second lower electrode layer 554 and the first upper electrode layer 572 are formed of the aluminum alloy including scandium (Sc), chemical resistance is increased, which may thus reduce or eliminate a disadvantage caused when the lower electrode and the upper electrode are formed of pure aluminum. Further, during the manufacturing process, stability of a process such as dry etching or wet etching may be provided. Further, in the case in which the lower electrode and the upper electrode are formed of pure aluminum, oxidation is easily caused, but since the second lower electrode layer 554 and the first upper electrode layer 572 are formed of the aluminum alloy including scandium, chemical resistance against oxidation may be increased.

Figure 19:
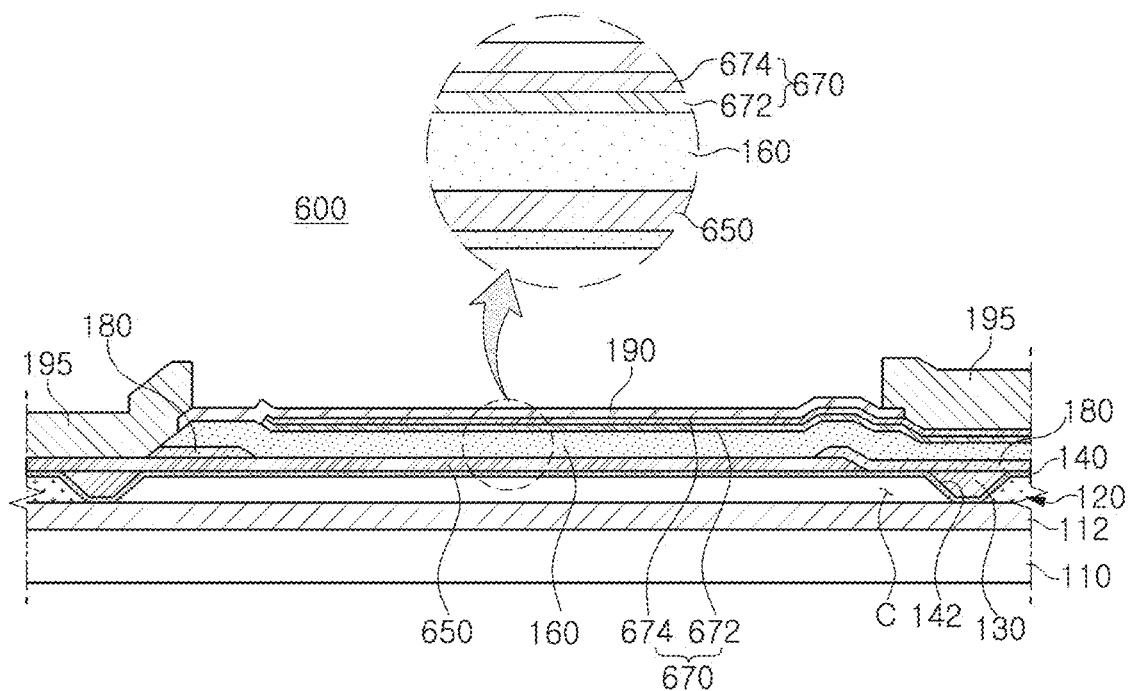
FIG. 19 is a schematic cross-sectional view illustrating a bulk acoustic wave resonator, according to another embodiment.

FIG. 19 is a schematic cross-sectional view illustrating a bulk acoustic wave resonator 600, according to another embodiment.

Referring to FIG. 19, the bulk acoustic wave resonator 600 may include the substrate 110, the sacrificial layer 120, the etch stop portion 130, the membrane layer 140, a lower electrode 650, the piezoelectric layer 160, an upper electrode 670, the insertion layer 180, the passivation layer 190, and the metal pad 195.

The lower electrode 650 may be formed on the membrane layer 140, and a portion of the lower electrode 650 may be disposed on the cavity C. In addition, the lower electrode 650 may be used as either one of an input electrode and an output electrode that inputs or outputs an electrical signal such as a radio frequency (RF) signal or the like.

The lower electrode 650 may be formed of a conductive material such as molybdenum (Mo) or an alloy thereof. However, the material of the lower electrode 650 is not limited to molybdenum (Mo), and the lower electrode 650 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 670 may be formed to at least cover a portion of the piezoelectric layer 160 disposed on the cavity C. The upper electrode 670 may be used as either one of an input electrode and an output electrode that inputs or outputs an electrical signal such as a radio frequency (RF) signal, or the like. That is, in a case in which the lower electrode 650 is used as the input electrode, the upper electrode 670 may be used as the output electrode, and in a case in which the lower electrode 650 is used as the output electrode, the upper electrode 670 may be used as the input electrode.

The upper electrode 670 may include a first upper electrode layer 672 formed of an aluminum alloy including scandium (Sc), and a second upper electrode layer 674 formed on the first upper electrode layer 672.

In addition, the second upper electrode layer 674 may be formed of a conductive material such as molybdenum (Mo) or an alloy thereof. However, the material of the second upper electrode layer 674 is not limited to molybdenum (Mo), and the second upper electrode layer 674 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

In addition, since the first upper electrode layer 672 is formed of the aluminum alloy including scandium (Sc), chemical resistance is increased, which may thus reduce or eliminate a disadvantage caused when the lower electrode and the upper electrode are formed of pure aluminum. Further, during the manufacturing process, stability of a process such as dry etching or wet etching may be provided. Further, in the case in which the lower electrode and the upper electrode are formed of pure aluminum, oxidation is easily caused, but since the first upper electrode layer 672 formed of the aluminum alloy including scandium is provided, chemical resistance against oxidation may be increased.

Figure 20:
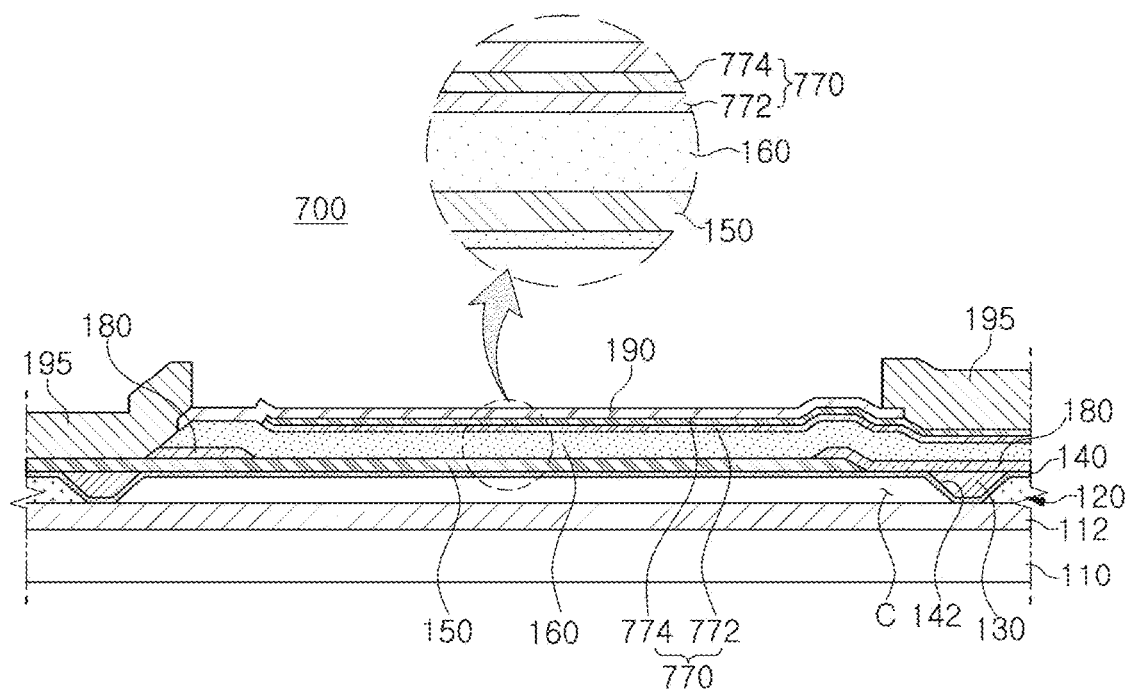
FIG. 20 is a schematic cross-sectional view illustrating a bulk acoustic wave resonator, according to another embodiment.

FIG. 20 is a schematic cross-sectional view illustrating a bulk acoustic wave resonator 700, according to another embodiment.

Referring to FIG. 20, the bulk acoustic wave resonator 700 may include the substrate 110, the sacrificial layer 120, the etch stop portion 130, the membrane layer 140, the lower electrode 150, the piezoelectric layer 160, an upper electrode 770, the insertion layer 180, the passivation layer 190, and the metal pad 195.

The upper electrode 770 may be formed to at least cover a portion of the piezoelectric layer 160 disposed on the cavity C. The upper electrode 770 may be used as either one of an input electrode and an output electrode that inputs or outputs an electrical signal such as a radio frequency (RF) signal, or the like. That is, in a case in which the lower electrode 150 is used as the input electrode, the upper electrode 770 may be used as the output electrode, and in a case in which the lower electrode 150 is used as the output electrode, the upper electrode 770 may be used as the input electrode.

The upper electrode 770 may include a first upper electrode layer 772, and a second upper electrode layer 774 disposed on the first upper electrode layer 772 and formed of an aluminum alloy including scandium (Sc).

In addition, the first upper electrode layer 772 may be formed of a conductive material such as molybdenum (Mo) or an alloy thereof. However, the material of the first upper electrode layer 772 is not limited to molybdenum (Mo), and the first upper electrode layer 772 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 21:
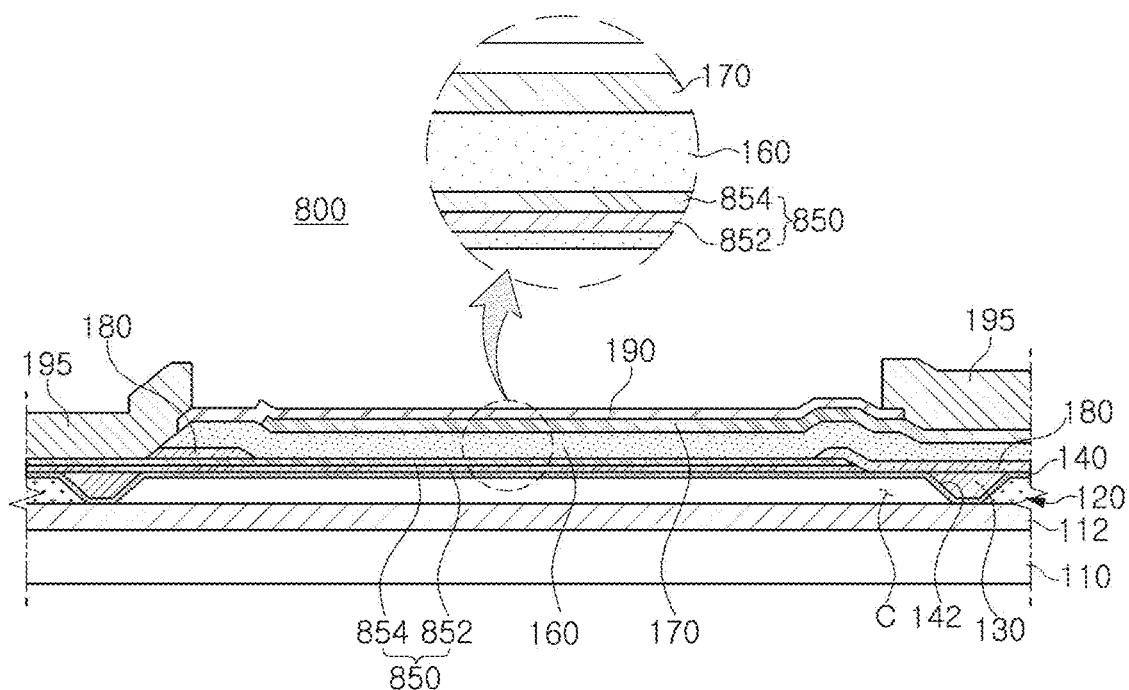
FIG. 21 is a schematic cross-sectional view illustrating a bulk acoustic wave resonator, according to another embodiment.

FIG. 21 is a schematic cross-sectional view illustrating a bulk acoustic wave resonator 800, according to another embodiment.

Referring to FIG. 21, the bulk acoustic wave resonator 800 may include the substrate 110, the sacrificial layer 120, the etch stop portion 130, the membrane layer 140, a lower electrode 850, the piezoelectric layer 160, the upper electrode 170, the insertion layer 180, the passivation layer 190, and the metal pad 195.

The lower electrode 850 may be formed on the membrane layer 140, and a portion of the lower electrode 850 may be disposed on the cavity C. In addition, the lower electrode 850 may be used as either one of an input electrode and an output electrode that inputs or outputs an electrical signal such as a radio frequency (RF) signal or the like.

As an example, the lower electrode 850 may include a first lower electrode layer 852, and a second lower electrode layer 854 formed on the first lower electrode layer 852 and formed of an aluminum alloy including scandium (Sc).

The first lower electrode layer 852 may be formed of a conductive material such as molybdenum (Mo) or an alloy thereof. However, the material of the first lower electrode layer 852 is not limited to molybdenum (Mo), and the first lower electrode layer 852 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 22:
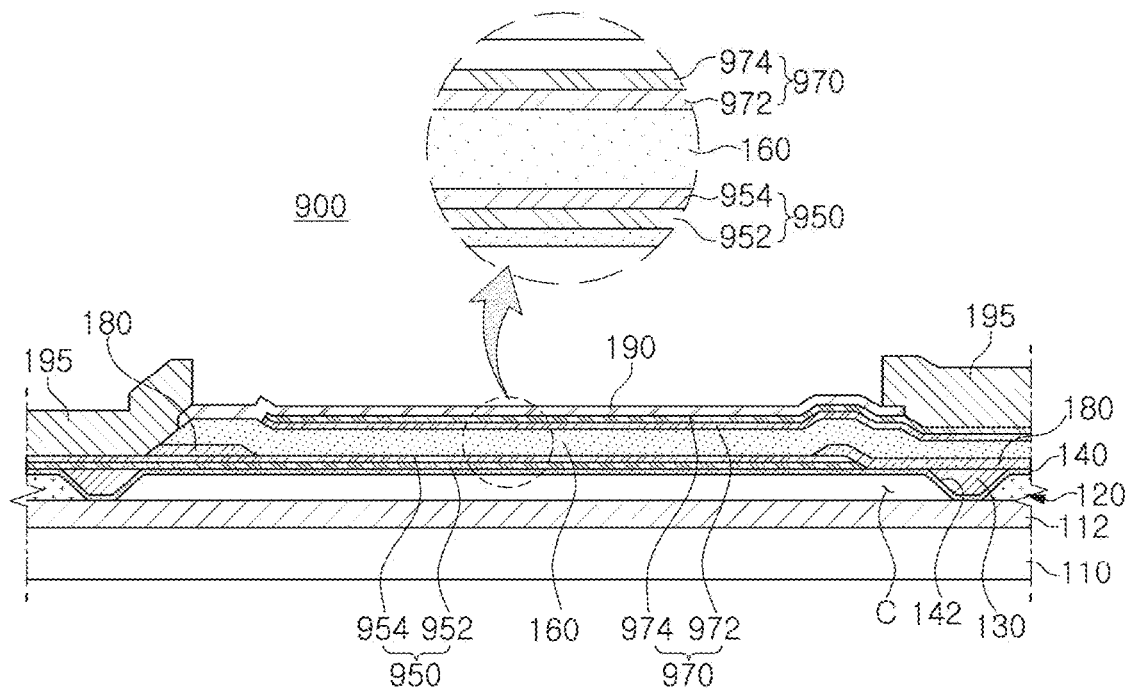
FIG. 22 is a schematic cross-sectional view illustrating a bulk acoustic wave resonator, according to another embodiment.

FIG. 22 is a schematic cross-sectional view illustrating a bulk acoustic wave resonator 900, according to another embodiment.

Referring to FIG. 22, the bulk acoustic wave resonator 900 may include the substrate 110, the sacrificial layer 120, the etch stop portion 130, the membrane layer 140, a lower electrode 950, the piezoelectric layer 160, an upper electrode 970, the insertion layer 180, the passivation layer 190, and the metal pad 195.

The lower electrode 950 may be formed on the membrane layer 140, and a portion of the lower electrode 950 may be disposed on the cavity C. In addition, the lower electrode 950 may be used as either one of an input electrode and an output electrode that inputs or outputs an electrical signal such as a radio frequency (RF) signal or the like.

As an example, the lower electrode 950 may include a first lower electrode layer 952 formed of an aluminum alloy including scandium (Sc), and a second lower electrode layer 952 formed on the first lower electrode layer 954.

The second lower electrode layer 954 may be formed of a conductive material such as molybdenum (Mo) or an alloy thereof. However, the material of the second lower electrode layer 954 is not limited to molybdenum (Mo), and the second lower electrode layer 954 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 970 may be formed to at least cover a portion of the piezoelectric layer 160 disposed on the cavity C. The upper electrode 970 may be used as either one of an input electrode and an output electrode that inputs or outputs an electrical signal such as a radio frequency (RF) signal, or the like. That is, in a case in which the lower electrode 950 is used as the input electrode, the upper electrode 970 may be used as the output electrode, and in a case in which the lower electrode 950 is used as the output electrode, the upper electrode 970 may be used as the input electrode.

The upper electrode 970 may include a first upper electrode layer 972, and a second upper electrode layer 974 disposed on the first upper electrode layer 972 and formed of an aluminum alloy including scandium (Sc).

In addition, the first upper electrode layer 972 may be formed of a conductive material such as molybdenum (Mo) or an alloy thereof. However, the material of the first upper electrode layer 972 is not limited to molybdenum (Mo), and the first upper electrode layer 972 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 23:
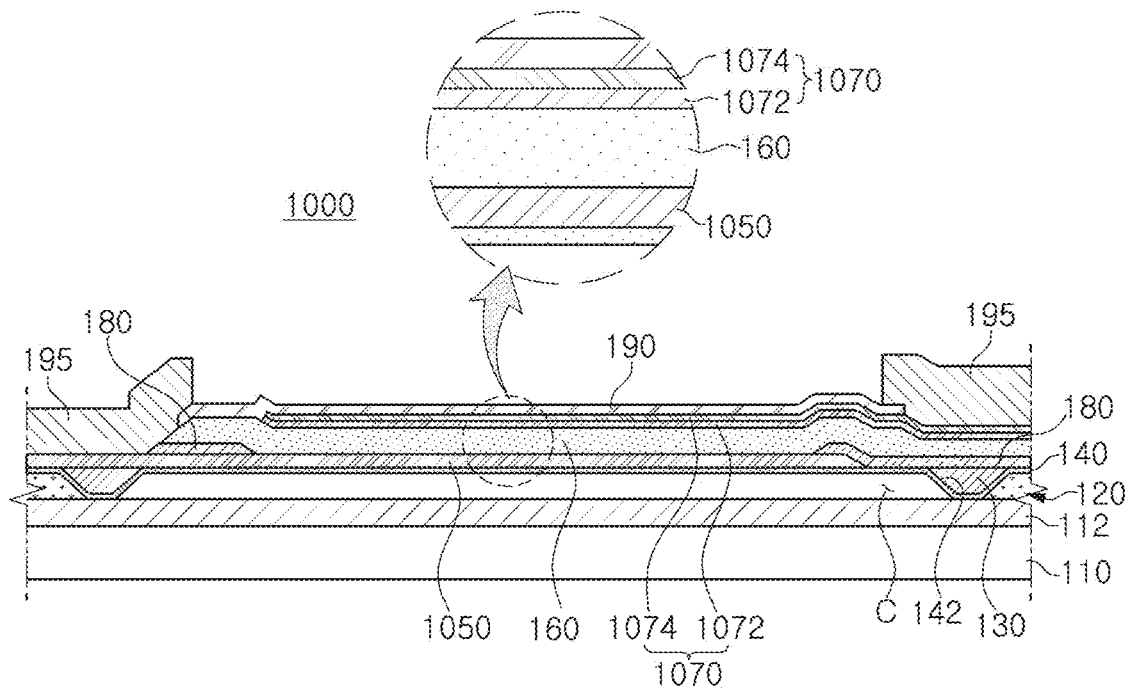
FIG. 23 is a schematic cross-sectional view illustrating a bulk acoustic wave resonator, according to another embodiment.

FIG. 23 is a schematic cross-sectional view illustrating a bulk acoustic wave resonator 1000, according to another embodiment.

Referring to FIG. 23, the bulk acoustic wave resonator 1000 may include the substrate 110, the sacrificial layer 120, the etch stop portion 130, the membrane layer 140, a lower electrode 1050, the piezoelectric layer 160, an upper electrode 1070, the insertion layer 180, the passivation layer 190, and the metal pad 195.

The lower electrode 1050 may be formed on the membrane layer 140, and a portion of the lower electrode 1050 may be disposed on the cavity C. In addition, the lower electrode 1050 may be used as either one of an input electrode and an output electrode that inputs or outputs an electrical signal such as a radio frequency (RF) signal or the like.

The lower electrode 1050 may be formed of, for example, a conductive material such as molybdenum (Mo) or an alloy thereof. However, the material of the lower electrode 1050 is not limited to molybdenum (Mo), and the lower electrode 1050 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 1070 may be formed to at least cover a portion of the piezoelectric layer 160 disposed on the cavity C. The upper electrode 1070 may be used as either one of an input electrode and an output electrode that inputs or outputs an electrical signal such as a radio frequency (RF) signal, or the like. That is, in a case in which the lower electrode 1050 is used as the input electrode, the upper electrode 1070 may be used as the output electrode, and in a case in which the lower electrode 1050 is used as the output electrode, the upper electrode 1070 may be used as the input electrode.

The upper electrode 1070 may include a first upper electrode layer 1072, and a second upper electrode layer 1074 disposed on the first upper electrode layer 1072 and formed of an aluminum alloy including scandium (Sc).

In addition, the first upper electrode layer 1072 may be formed of a conductive material such as molybdenum (Mo) or an alloy thereof. However, the material of the first upper electrode layer 1072 is not limited to molybdenum (Mo), and the first upper electrode layer 1072 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 24:
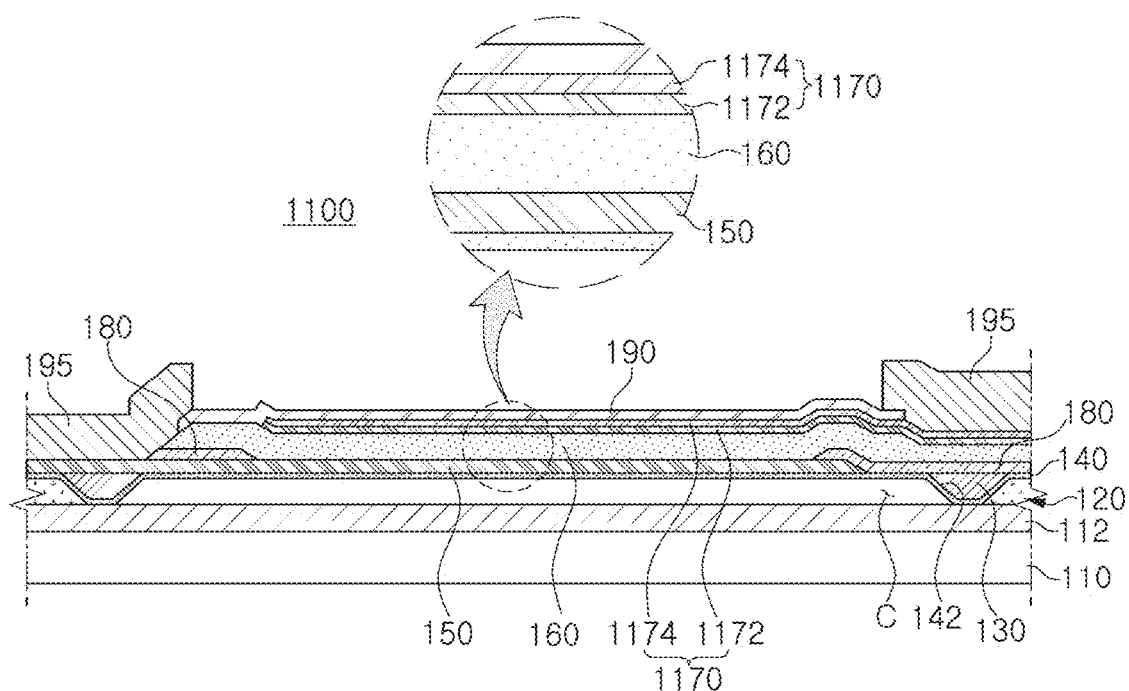
FIG. 24 is a schematic cross-sectional view illustrating a bulk acoustic wave resonator, according to another embodiment.

FIG. 24 is a schematic cross-sectional view illustrating a bulk acoustic wave resonator 1100, according to another embodiment.

Referring to FIG. 24, the bulk acoustic wave resonator 1100 may include the substrate 110, the sacrificial layer 120, the etch stop portion 130, the membrane layer 140, the lower electrode 150, the piezoelectric layer 160, an upper electrode 1170, the insertion layer 180, the passivation layer 190, and the metal pad 195.

The upper electrode 1170 may be formed to at least cover a portion of the piezoelectric layer 160 disposed on the cavity C. The upper electrode 1170 may be used as either one of an input electrode and an output electrode that inputs or outputs an electrical signal such as a radio frequency (RF) signal, or the like. That is, in a case in which the lower electrode 150 is used as the input electrode, the upper electrode 1170 may be used as the output electrode, and in a case in which the lower electrode 150 is used as the output electrode, the upper electrode 1170 may be used as the input electrode.

The upper electrode 1170 may include a first upper electrode layer 1172 formed of an aluminum alloy including scandium (Sc), and a second upper electrode layer 1172 formed on the first upper electrode layer 1174.

The second upper electrode layer 1174 may be formed of a conductive material such as molybdenum (Mo) or an alloy thereof. However, the material of the second upper electrode layer 1174 is not limited to molybdenum (Mo), and the second upper electrode layer 1174 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 25:
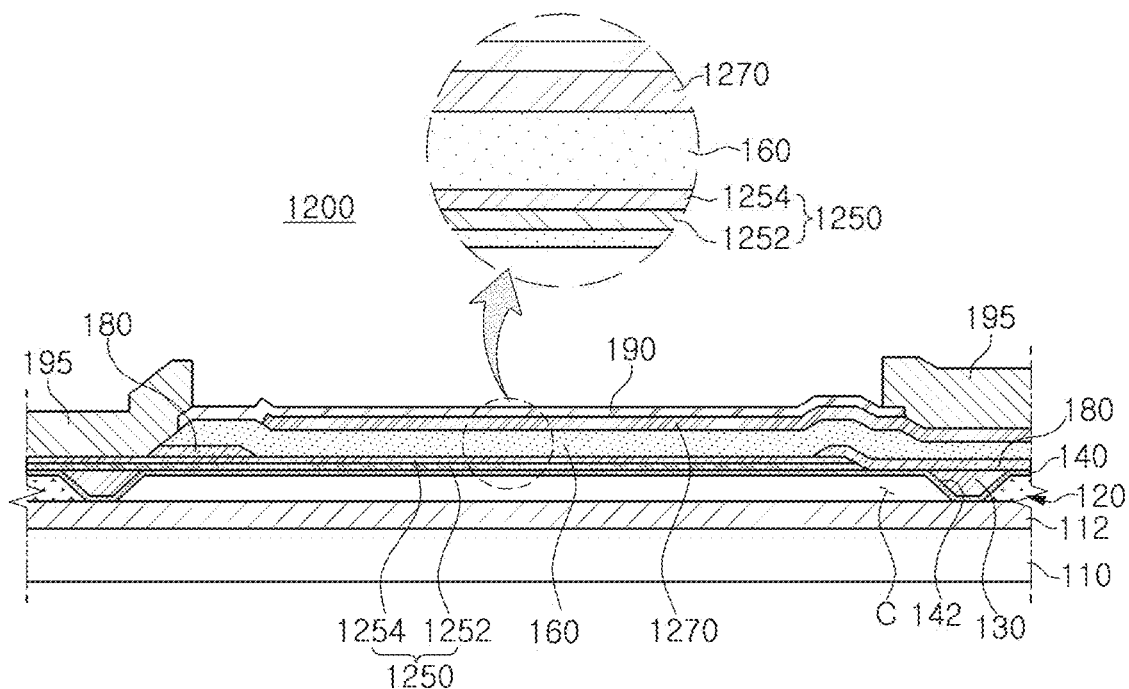
FIG. 25 is a schematic cross-sectional view illustrating a bulk acoustic wave resonator, according to another embodiment.

FIG. 25 is a schematic cross-sectional view illustrating a bulk acoustic wave resonator 1200, according to another embodiment.

Referring to FIG. 25, the bulk acoustic wave resonator 1200 may include the substrate 110, the sacrificial layer 120, the etch stop portion 130, the membrane layer 140, a lower electrode 1250, the piezoelectric layer 160, an upper electrode 1270, the insertion layer 180, the passivation layer 190, and the metal pad 195.

The lower electrode 1250 may be formed on the membrane layer 140, and a portion of the lower electrode 1250 may be disposed on the cavity C. In addition, the lower electrode 1250 may be used as either one of an input electrode and an output electrode that inputs or outputs an electrical signal such as a radio frequency (RF) signal or the like.

As an example, the lower electrode 1250 may include a first lower electrode layer 1252 formed of an aluminum alloy including scandium (Sc), and a second lower electrode layer 1254 formed on the first lower electrode layer 1252.

The second lower electrode layer 1254 may be formed of, for example, a conductive material such as molybdenum (Mo) or an alloy thereof. However, the material of the second lower electrode layer 1254 is not limited to molybdenum (Mo), and the second lower electrode layer 1254 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 1270 may be formed to at least cover a portion of the piezoelectric layer 160 disposed on the cavity C. The upper electrode 1270 may be used as either one of an input electrode and an output electrode that inputs or outputs an electrical signal such as a radio frequency (RF) signal, or the like. That is, in a case in which the lower electrode 1250 is used as the input electrode, the upper electrode 1270 may be used as the output electrode, and in a case in which the lower electrode 1250 is used as the output electrode, the upper electrode 1270 may be used as the input electrode.

The upper electrode 1270 may be formed of, for example, a conductive material such as molybdenum (Mo) or an alloy thereof. However, the material of the upper electrode 1270 is not limited to molybdenum (Mo), and the upper electrode 1270 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 26:
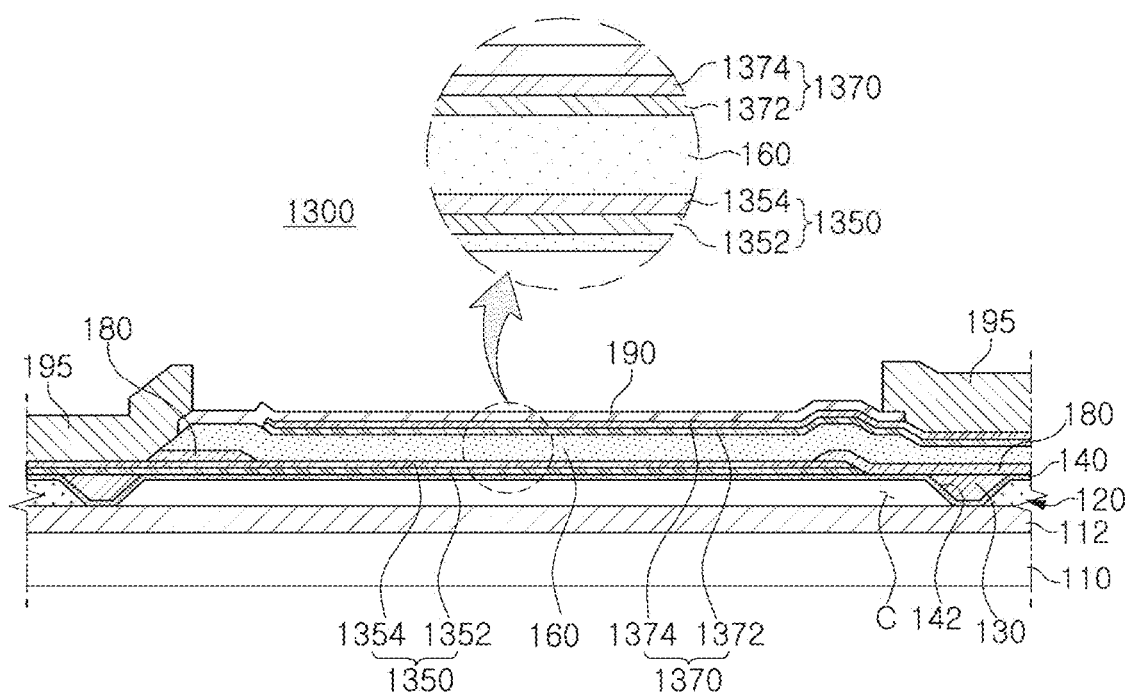
FIG. 26 is a schematic cross-sectional view illustrating a bulk acoustic wave resonator, according to another embodiment.

FIG. 26 is a schematic cross-sectional view illustrating a bulk acoustic wave resonator 1300, according to another embodiment.

Referring to FIG. 26, the bulk acoustic wave resonator 1300 may include the substrate 110, the sacrificial layer 120, the etch stop portion 130, the membrane layer 140, a lower electrode 1350, the piezoelectric layer 160, an upper electrode 1370, the insertion layer 180, the passivation layer 190, and the metal pad 195.

The lower electrode 1350 may be formed on the membrane layer 140, and a portion of the lower electrode 1350 may be disposed on the cavity C. In addition, the lower electrode 1350 may be used as either one of an input electrode and an output electrode that inputs or outputs an electrical signal such as a radio frequency (RF) signal or the like.

As an example, the lower electrode 1350 may include a first lower electrode layer 1352 formed of an aluminum alloy including scandium (Sc), and a second lower electrode layer 1354 formed on the first lower electrode layer 1352.

The second lower electrode layer 1354 may be formed of, for example, a conductive material such as molybdenum (Mo) or an alloy thereof. However, the material of the second lower electrode layer 1354 is not limited to molybdenum (Mo), and the second lower electrode layer 1354 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 1370 may be formed to at least cover a portion of the piezoelectric layer 160 disposed on the cavity C. The upper electrode 1370 may be used as either one of an input electrode and an output electrode that inputs or outputs an electrical signal such as a radio frequency (RF) signal, or the like. That is, in a case in which the lower electrode 1350 is used as the input electrode, the upper electrode 1370 may be used as the output electrode, and in a case in which the lower electrode 1350 is used as the output electrode, the upper electrode 1370 may be used as the input electrode.

The upper electrode 1370 may include a first upper electrode layer 1372 formed of an aluminum alloy including scandium (Sc), and a second upper electrode layer 1374 formed on the first upper electrode layer 1372.

In addition, the second upper electrode layer 1374 may be formed of a conductive material such as molybdenum (Mo) or an alloy thereof. However, the material of the second upper electrode layer 1374 is not limited to molybdenum (Mo), and the second upper electrode layer 1374 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 27:
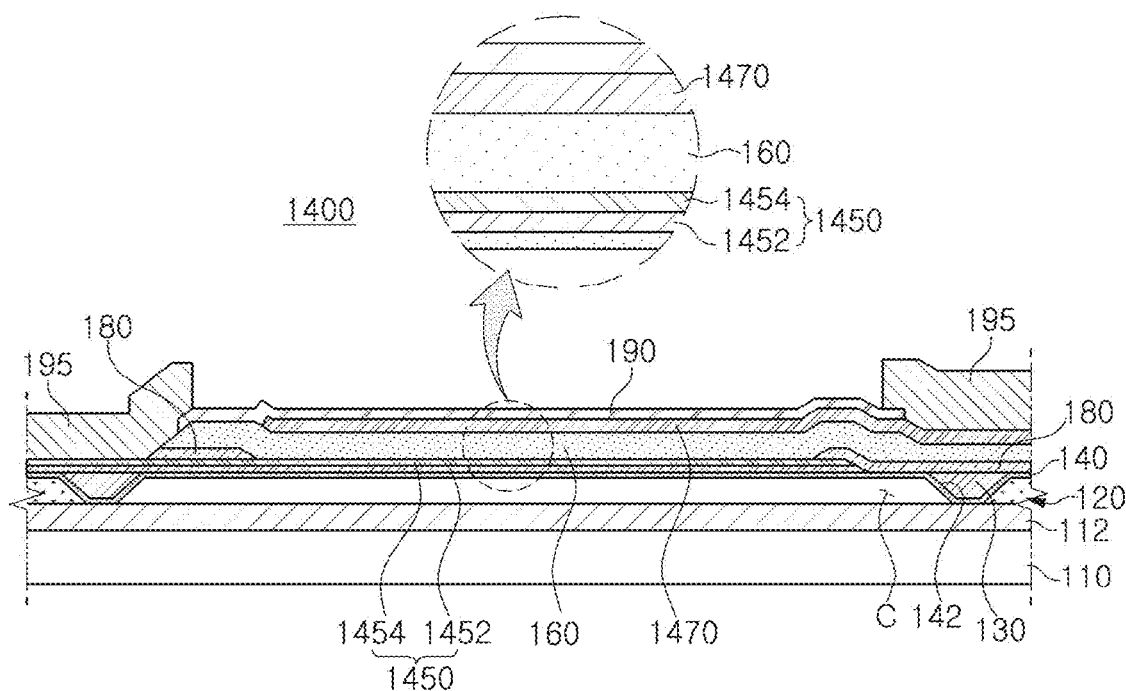
FIG. 27 is a schematic cross-sectional view illustrating a bulk acoustic wave resonator, according to another embodiment.

FIG. 27 is a schematic cross-sectional view illustrating a bulk acoustic wave resonator 1400, according to another embodiment.

Referring to FIG. 27, the bulk acoustic wave resonator 1400 may include the substrate 110, the sacrificial layer 120, the etch stop portion 130, the membrane layer 140, a lower electrode 1450, the piezoelectric layer 160, an upper electrode 1470, the insertion layer 180, the passivation layer 190, and the metal pad 195.

The lower electrode 1450 may be formed on the membrane layer 140, and a portion of the lower electrode 1450 may be disposed on the cavity C. In addition, the lower electrode 1450 may be used as either one of an input electrode and an output electrode that inputs or outputs an electrical signal such as a radio frequency (RF) signal or the like.

As an example, the lower electrode 1450 may include a first lower electrode layer 1452, and a second lower electrode layer 1454 formed on the first lower electrode layer 1452 and formed of an aluminum alloy including scandium (Sc).

The first lower electrode layer 1452 may be formed of a conductive material such as molybdenum (Mo) or an alloy thereof. However, the material of the first lower electrode layer 1452 is not limited to molybdenum (Mo), and the first lower electrode layer 1452 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 1470 may be formed to at least cover a portion of the piezoelectric layer 160 disposed on the cavity C. The upper electrode 1470 may be used as either one of an input electrode and an output electrode that inputs or outputs an electrical signal such as a radio frequency (RF) signal, or the like. That is, in a case in which the lower electrode 1450 is used as the input electrode, the upper electrode 1470 may be used as the output electrode, and in a case in which the lower electrode 1450 is used as the output electrode, the upper electrode 1470 may be used as the input electrode.

Meanwhile, the upper electrode 1470 may be formed of a conductive material such as molybdenum (Mo) or an alloy thereof. However, the material of the upper electrode 1470 is not limited to molybdenum (Mo), and the upper electrode 1470 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Figure 28:
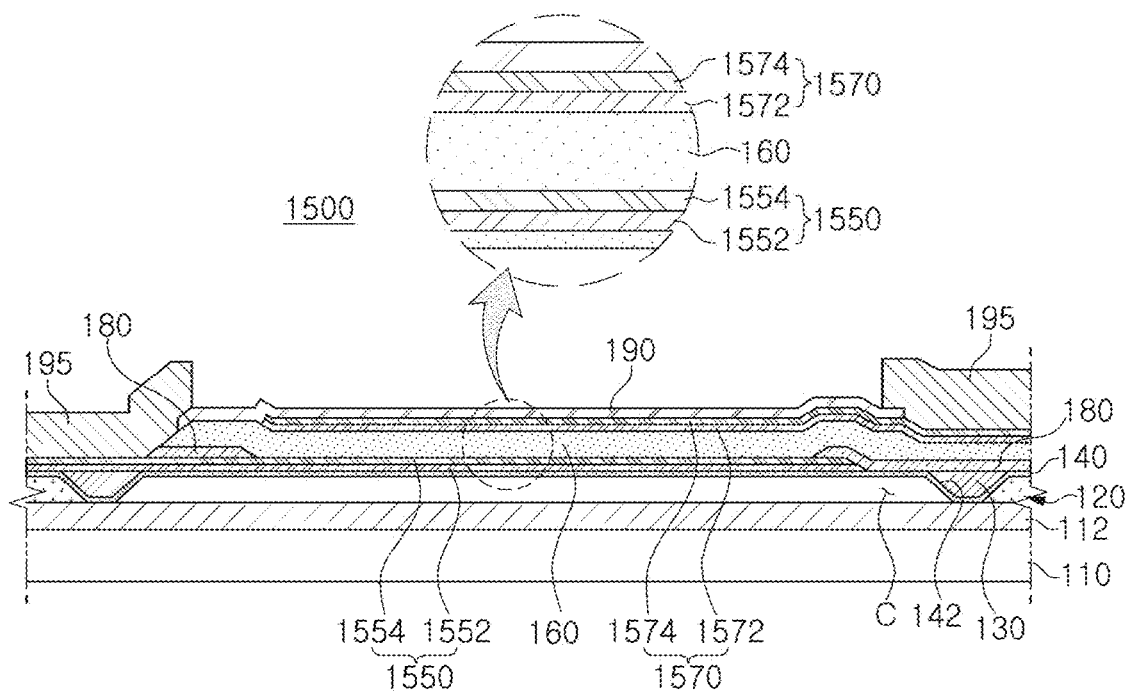
FIG. 28 is a schematic cross-sectional view illustrating a bulk acoustic wave resonator, according to another embodiment.

FIG. 28 is a schematic cross-sectional view illustrating a bulk acoustic wave resonator 1500, according to another embodiment.

Referring to FIG. 28, the bulk acoustic wave resonator 1500 may include the substrate 110, the sacrificial layer 120, the etch stop portion 130, the membrane layer 140, a lower electrode 1550, the piezoelectric layer 160, an upper electrode 1570, the insertion layer 180, the passivation layer 190, and the metal pad 195.

The lower electrode 1550 may be formed on the membrane layer 140, and a portion of the lower electrode 1550 may be disposed on the cavity C. In addition, the lower electrode 1550 may be used as either one of an input electrode and an output electrode that inputs or outputs an electrical signal such as a radio frequency (RF) signal or the like.

As an example, the lower electrode 1550 may include a first lower electrode layer 1552, and a second lower electrode layer 1554 formed on the first lower electrode layer 1552 and formed of an aluminum alloy including scandium (Sc).

The first lower electrode layer 1552 may be formed of, for example, a conductive material such as molybdenum (Mo) or an alloy thereof. However, the material of the first lower electrode layer 1552 is not limited to molybdenum (Mo), and the first lower electrode layer 1552 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

The upper electrode 1570 may be formed to at least cover a portion of the piezoelectric layer 160 disposed on the cavity C. The upper electrode 1570 may be used as either one of an input electrode and an output electrode that inputs and outputs an electrical signal such as a radio frequency (RF) signal, or the like. That is, in a case in which the lower electrode 1550 is used as the input electrode, the upper electrode 1570 may be used as the output electrode, and in a case in which the lower electrode 1550 is used as the output electrode, the upper electrode 1570 may be used as the input electrode.

The upper electrode 1570 may include a first upper electrode layer 1572, and a second upper electrode layer 1574 disposed on the first upper electrode layer 1572 and formed of an aluminum alloy including scandium (Sc).

In addition, the first upper electrode layer 1572 may be formed of a conductive material such as molybdenum (Mo) or an alloy thereof. However, the material of the first upper electrode layer 1572 is not limited to molybdenum (Mo), and the first upper electrode layer 1572 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or an alloy thereof.

Hereinafter, characteristics of the bulk acoustic wave resonators according to the various embodiments disclosed herein will be described through the following Table 3.

In the respective embodiments, the resonator had a size of 125×125 μm, and a resonator frequency (Fs) was tuned to about 5 GHz. In addition, doped aluminum nitride (AlScN) having the content of 6.25 at % of scandium (Sc) was used as a piezoelectric layer.

A seed layer formed of aluminum nitride (AlN) was stacked below the lower electrode, and had a thickness of 500 Å. In addition, a passivation layer formed of silicon oxide (SiO) was stacked on the upper electrode, and had a thickness of 1000 Å.

As illustrated in the following table, when the upper electrode and the lower electrode including a layer of aluminum alloy including scandium (Sc) were used, since the thickness of the electrode was increased, insertion loss was reduced, and in particular, when the lower electrode including the layer of aluminum alloy including scandium (Sc) was used, crystal orientation of the piezoelectric layer AlScN was improved.

TABLE 3

| Embodiment | Structure | Material | Resonator Frequency (Fs, GHz) | Thickness (Å) | Electrical Characteristic (Insertion Loss, dB) | Mechanical Characteristic ($Kt^2$) | Crystal Orientation of Piezoelectric Layer |
|---|---|---|---|---|---|---|---|
| 1 | Upper Electrode | AlSc | 4.97 | 1000 | 0.032 | 7.34 | 0.75 |
|   | Piezoelectric Layer | AlScN |  | 6000 |  |  |  |
|   | Lower Electrode | AlSc |  | 1500 |  |  |  |
| 2 | Upper Electrode | AlSc | 5.04 | 1200 | 0.078 | 7.89 | 1.95 |
|   | Piezoelectric Layer | AlScN |  | 5000 |  |  |  |
|   | Lower Electrode | Mo |  | 1000 |  |  |  |
| 3 | Upper Electrode | Mo | 4.91 | 1000 | 0.070 | 7.83 | 0.81 |
|   | Piezoelectric Layer | AlScN |  | 5000 |  |  |  |
|   | Lower Electrode | AlSc |  | 1500 |  |  |  |
| 4 | Upper Electrode | AlSc | 5.01 | 1200 | 0.058 | 7.18 | 2.12 |
|   | Piezoelectric Layer | AlScN |  | 4500 |  |  |  |
|   | Second Lower Electrode Layer | Mo |  | 1000 |  |  |  |
|   | First Lower Electrode Layer | AlSc |  | 1000 |  |  |  |
| 5 | Second Upper Electrode Layer | Mo | 4.98 | 500 | 0.084 | 7.01 | 1.32 |
|   | First Upper Electrode Layer | AlSc |  | 500 |  |  |  |
|   | Piezoelectric Layer | AlScN |  | 4500 |  |  |  |
|   | Second Lower Electrode Layer | AlSc |  | 500 |  |  |  |
|   | First Lower Electrode Layer | Mo |  | 500 |  |  |  |
| 6 | Second Upper Electrode Layer | Mo | 4.91 | 500 | 0.086 | 7.98 | 2.01 |
|   | First Upper Electrode Layer | AlSc |  | 500 |  |  |  |
|   | Piezoelectric Layer | AlScN |  | 4500 |  |  |  |
|   | Lower Electrode | Mo |  | 1000 |  |  |  |

TABLE 3-continued

| Embodiment | Structure | Material | Resonator Frequency (Fs, GHz) | Thickness (Å) | Electrical Characteristic (Insertion Loss, dB) | Mechanical Characteristic ($Kt^2$) | Crystal Orientation of Piezoelectric Layer |
|---|---|---|---|---|---|---|---|
| 7 | Second Upper Electrode Layer | AlSc | 5.09 | 1000 | 0.064 | 8.05 | 0.78 |
|  | First Upper Electrode Layer | Mo |  | 500 |  |  |  |
|  | Piezoelectric Layer | AlScN |  | 5500 |  |  |  |
|  | Lower Electrode | AlSc |  | 1000 |  |  |  |
| 8 | Upper Electrode | AlSc | 5.06 | 1200 | 0.071 | 7.03 | 1.21 |
|  | Piezoelectric Layer | AlScN |  | 5000 |  |  |  |
|  | Second Lower Electrode Layer | AlSc |  | 500 |  |  |  |
|  | First Lower Electrode Layer | Mo |  | 500 |  |  |  |
| 9 | Second Upper Electrode Layer | AlSc | 5.05 | 1000 | 0.061 | 7.95 | 2.27 |
|  | First Upper Electrode Layer | Mo |  | 500 |  |  |  |
|  | Piezoelectric Layer | AlScN |  | 4500 |  |  |  |
|  | Second Lower Electrode Layer | Mo |  | 500 |  |  |  |
|  | First Lower Electrode Layer | AlSc |  | 1000 |  |  |  |
| 10 | Second Upper Electrode Layer | AlSc | 4.94 | 1000 | 0.073 | 8.46 | 2.01 |
|  | First Upper Electrode Layer | Mo |  | 500 |  |  |  |
|  | Piezoelectric Layer | AlScN |  | 4500 |  |  |  |
|  | Lower Electrode | Mo |  | 1000 |  |  |  |
| 11 | Second Upper Electrode Layer | Mo | 5.06 | 500 | 0.076 | 7.59 | 0.78 |
|  | First Upper Electrode Layer | AlSc |  | 500 |  |  |  |
|  | Piezoelectric Layer | AlScN |  | 5500 |  |  |  |
|  | Lower Electrode | AlSc |  | 1000 |  |  |  |
| 12 | Upper Electrode | Mo | 4.98 | 1000 | 0.068 | 8.47 | 2.28 |
|  | Piezoelectric Layer | AlScN |  | 4000 |  |  |  |
|  | Second Lower Electrode Layer | Mo |  | 800 |  |  |  |
|  | First Lower Electrode Layer | AlSc |  | 1000 |  |  |  |
| 13 | Second Upper Electrode Layer | Mo | 5.07 | 500 | 0.078 | 7.4 | 2.3 |
|  | First Upper Electrode Layer | AlSc |  | 600 |  |  |  |
|  | Piezoelectric Layer | AlScN |  | 4500 |  |  |  |
|  | Second Lower Electrode Layer | Mo |  | 500 |  |  |  |
|  | First Lower Electrode Layer | AlSc |  | 600 |  |  |  |
| 14 | Upper Electrode | Mo | 4.96 | 1000 | 0.086 | 8.01 | 1.32 |
|  | Piezoelectric Layer | AlScN |  | 4500 |  |  |  |
|  | Second Lower Electrode Layer | AlSc |  | 500 |  |  |  |
|  | First Lower Electrode Layer | Mo |  | 500 |  |  |  |
| 15 | Second Upper Electrode Layer | AlSc | 5.04 | 1000 | 0.061 | 7.95 | 1.29 |
|  | First Upper Electrode Layer | Mo |  | 500 |  |  |  |
|  | Piezoelectric Layer | AlScN |  | 4500 |  |  |  |
|  | Second Lower Electrode Layer | AlSc |  | 1000 |  |  |  |
|  | First Lower Electrode Layer | Mo |  | 500 |  |  |  |

Figure 29:
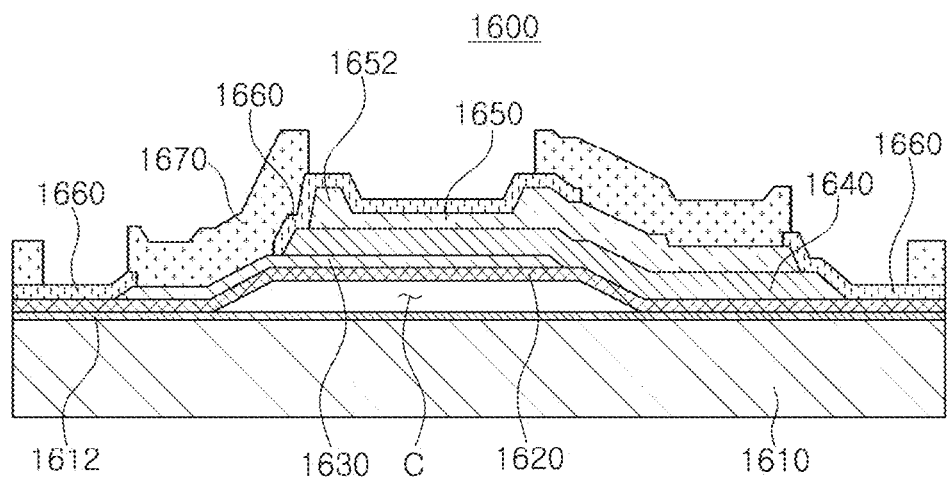
FIG. 29 is a schematic cross-sectional view illustrating a bulk acoustic wave resonator, according to another embodiment.

FIG. 29 is a schematic cross-sectional view illustrating a bulk acoustic wave resonator 1600, according to another embodiment.

Referring to FIG. 29, the bulk acoustic wave resonator 1600 may include a substrate 1610, a membrane layer 1620, a lower electrode 1630, a piezoelectric layer 1640, an upper electrode 1650, a passivation layer 1660, and a metal pad 1670.

The substrate 1610 may be a substrate on which silicon is stacked. For example, a silicon wafer may be used as the substrate 1610. The substrate 1610 may include a substrate protective layer 1612 disposed to face a cavity C.

The substrate protective layer 1612 may prevent damage on the substrate 1610 when the cavity C is formed.

As an example, the substrate protective layer 1612 may be formed of at least one of silicon dioxide ($SiO_2$), silicon nitride (Si$_3$N$_4$), aluminum oxide (Al$_2$O$_3$), and aluminum nitride (AlN), and may be formed by any one of a chemical vapor deposition process, an RF magnetron sputtering process, and an evaporation process.

The membrane layer 1620 may be formed on a sacrificial layer (not shown) that is finally removed, and may form the cavity C together with the substrate protective layer 1612 by removing the sacrificial layer. That is, in order to form the cavity C, the sacrificial layer (not shown) may be formed on the substrate 1610 and may be then removed to thereby form the cavity C. A dielectric layer containing any one of silicon nitride (Si$_3$N$_4$), silicon oxide (SiO$_2$), manganese oxide (MgO), zirconium oxide (ZrO$_2$), aluminum nitride (AlN), lead zirconate titanate (PZT), gallium arsenic (GaAs), hafnium oxide (HfO$_2$), aluminum oxide (Al$_2$O$_3$), titanium oxide (TiO$_2$), and zinc oxide (ZnO) may be used as the membrane layer 1620.

A seed layer (not shown) formed of aluminum nitride (AlN) may be formed on the membrane layer 1620. That is, the seed layer may be disposed between the membrane layer 1620 and the lower electrode 1630. The seed layer may be formed of a dielectric or a metal having a hexagonal close-packed (HCP) crystal structure other than aluminum nitride (AlN). As an example, in a case in which the seed layer is formed of the metal, the seed layer may be formed of titanium (Ti).

The lower electrode 1630 may be formed on the membrane layer 1620. In addition, the lower electrode 1630 may be used as either one of an input electrode and an output electrode that inputs or outputs an electrical signal such as a radio frequency (RF) signal or the like.

The lower electrode 1630 may be formed of, for example, an aluminum alloy including scandium (Sc). As such, high power reactive sputtering may be increased with an increase in mechanical strength. Under such a deposition condition, an increase in surface roughness of the lower electrode 1630 may be prevented and high orientation growth of the piezoelectric layer 1640 may also be induced.

In addition, since scandium (Sc) is contained in the lower electrode 1630, chemical resistance of the lower electrode 1630 may be increased, which may thus reduce or eliminate a disadvantage caused when the lower electrode is formed of pure aluminum. Further, during the manufacturing process, stability of a process such as dry etching or wet etching may be provided. Further, in the case in which the lower electrode is formed of pure aluminum, oxidation is easily caused, but since the lower electrode 1630 is formed of the aluminum alloy including scandium, chemical resistance against oxidation may be increased.

The piezoelectric layer 1640 may cover at least a portion of the lower electrode 1630. The piezoelectric layer 1640, which is a portion generating a piezoelectric effect that converts electric energy into mechanical energy in a form of elastic waves, may be formed of any one of aluminum nitride (AlN), zinc oxide (ZnO), and lead zirconium titanium oxide (PZT; PbZrTiO). In addition, in a case in which the piezoelectric layer 1640 is formed of aluminum nitride (AlN), the piezoelectric layer 1640 may further include a rare earth metal. As an example, the rare earth metal may include any one or any combination of any two or more of scandium (Sc), erbium (Er), yttrium (Y), and lanthanum (La). In addition, as an example, the transition metal may include at least one of titanium (Ti), zirconium (Zr), hafnium (Hf), tantalum (Ta), and niobium (Nb). In addition, the transition metal may also include magnesium (Mg), which is a divalent metal.

The upper electrode 1650 may be formed to at least cover a portion of the piezoelectric layer 1640 disposed on the cavity C. The upper electrode 1650 may be used as either one of an input electrode and an output electrode that inputs or outputs an electrical signal such as a radio frequency (RF) signal, or the like. That is, in a case in which the lower electrode 1630 is used as the input electrode, the upper electrode 1650 may be used as the output electrode, and in a case in which the lower electrode 1630 is used as the output electrode, the upper electrode 1650 may be used as the input electrode.

The upper electrode 1650 may also be formed of an aluminum alloy including scandium (Sc), similarly to like the lower electrode 1630.

In addition, the upper electrode 1650 may include a frame portion 1652 disposed at an edge of an active area, that is, an area in which all of the lower electrode 1630, the piezoelectric layer 1640, and the upper electrode 1650 are disposed to be overlapped with each other. The frame portion 1652 may have a thickness greater than a thickness of the remaining portion of the upper electrode 1650. As an example, the frame portion 1652 may reflect a lateral wave generated during the resonance into the active area to trap resonance energy in the active area.

The passivation layer 1660 may be formed on the lower electrode 1630 and a region of the upper electrode 1650 excluding a portion of the upper electrode 1650. The passivation layer 1660 may prevent damage to the upper electrode 1650 and the lower electrode 1630 during the manufacturing process of the bulk acoustic wave resonator 1600.

Further, in order to control a frequency in a final process, a thickness of the passivation layer 1660 may be controlled by etching. The same material as the material of the membrane layer 1620 may be used as a material of the passivation layer 1660. As an example, a dielectric layer containing any one of manganese oxide (MgO), zirconium oxide (ZrO$_2$), aluminum nitride (AlN), lead zirconate titanate (PZT), gallium arsenic (GaAs), hafnium oxide (HfO$_2$), aluminum oxide (Al$_2$O$_3$), titanium oxide (TiO$_2$), and zinc oxide (ZnO) may be used as the passivation layer 1660.

In addition, the metal pad 1670 may be formed on the lower electrode 1630 and the portion of the upper electrode 1650 on which the passivation layer 1660 is not formed. As an example, the metal pad 1670 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

Figure 30:
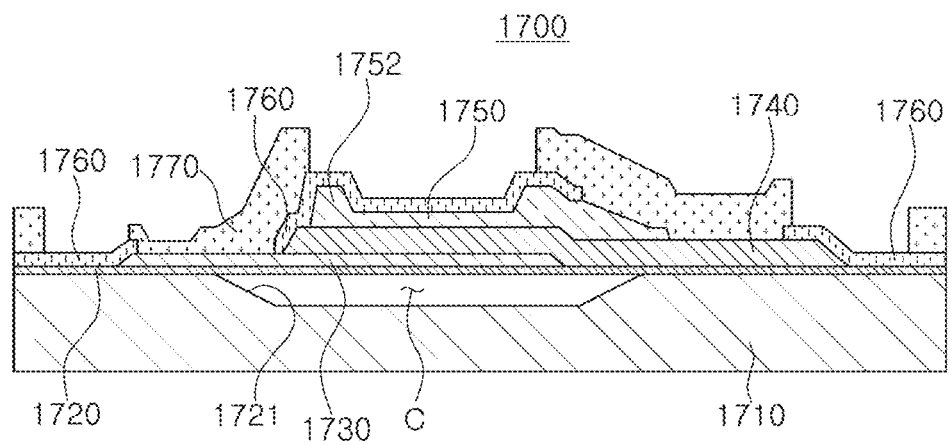
FIG. 30 is a schematic cross-sectional view illustrating a bulk acoustic wave resonator, according to another embodiment.

FIG. 30 is a schematic cross-sectional view illustrating a bulk acoustic wave resonator 1700, according to another embodiment.

Referring to FIG. 30, the bulk acoustic wave resonator 1700 may include a substrate 1710, a membrane layer 1720, a lower electrode 1730, a piezoelectric layer 1740, an upper electrode 1750, a passivation layer 1760, and a metal pad 1770.

The substrate 1710 may be a substrate on which silicon is stacked. For example, a silicon wafer may be used as the substrate 1710. The substrate 1710 may include a groove 1712 for forming a cavity C.

The groove 1712 may be disposed at the central portion of the substrate 1710 and may be disposed below an active area. The active area is to an area in which the lower electrode 1730, the piezoelectric layer 1740, and the upper electrode 1750 are all overlapped with each other.

The membrane layer 1720 may form the cavity C together with the substrate 1710. That is, the membrane layer 1720 may be formed to cover the groove 1712 of the substrate 1710. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the membrane layer 1720.

A seed layer (not shown) formed of aluminum nitride (AlN) may be formed on the membrane layer 1720. That is, the seed layer may be disposed between the membrane layer 1720 and the lower electrode 1730. The seed layer may be formed of a dielectric or a metal having a hexagonal close-packed (HCP) crystal structure other than aluminum nitride (AlN). As an example, in a case in which the seed layer is formed of the metal, the seed layer may be formed of titanium (Ti).

The lower electrode 1730 may be formed on the membrane layer 1720. In addition, the lower electrode 1730 may be used as either one of an input electrode and an output electrode that inputs or outputs an electrical signal such as a radio frequency (RF) signal or the like.

The lower electrode 1730 may be formed of an aluminum alloy including scandium (Sc). As such, high power reactive sputtering may be increased with an increase in mechanical strength. Under such deposition conditions, an increase in surface roughness of the lower electrode 1730 may be prevented and high orientation growth of the piezoelectric layer 1740 may also be induced.

In addition, since scandium (Sc) is contained in the lower electrode 1730, chemical resistance of the lower electrode 1730 may be increased, which may thus reduce or eliminate a disadvantage caused when the lower electrode is formed of pure aluminum. Further, during the manufacturing process, stability of a process such as dry etching or wet etching may be provided. Further, in the case in which the lower electrode is formed of pure aluminum, oxidation is easily caused, but since the lower electrode 1730 is formed of the aluminum alloy including scandium, chemical resistance against oxidation may be increased.

The piezoelectric layer 1740 may cover at least a portion of the lower electrode 1730. The piezoelectric layer 1740, which is a portion generating a piezoelectric effect that converts electric energy into mechanical energy in a form of elastic wave, may be formed of any one of aluminum nitride (AlN), zinc oxide (ZnO), and lead zirconium titanium oxide (PZT; PbZrTiO). In addition, in a case in which the piezoelectric layer 1740 is formed of aluminum nitride (AlN), the piezoelectric layer 1640 may further include a rare earth metal. As an example, the rare earth metal may include any one or any combination of any two or more of one of scandium (Sc), erbium (Er), yttrium (Y), and lanthanum (La). In addition, as an example, the transition metal may include at least one of titanium (Ti), zirconium (Zr), hafnium (Hf), tantalum (Ta), and niobium (Nb). In addition, the transition metal may also include magnesium (Mg), which is a divalent metal.

The upper electrode 1750 may be formed to at least cover a portion of the piezoelectric layer 1740 disposed on the cavity C. The upper electrode 1750 may be used as any one of an input electrode and an output electrode that inputs or outputs an electrical signal such as a radio frequency (RF) signal, or the like. That is, in a case in which the lower electrode 1730 is used as the input electrode, the upper electrode 1750 may be used as the output electrode, and in a case in which the lower electrode 1730 is used as the output electrode, the upper electrode 1750 may be used as the input electrode.

The upper electrode 1750 may also be formed of an aluminum alloy including scandium (Sc), similarly to the lower electrode 1730.

In addition, the upper electrode 1759 may include a frame portion 1752 disposed at an edge of the active area. The frame portion 1752 may have a thickness greater than a thickness of the remaining portion of the upper electrode 1750. As an example, the frame portion 1752 may reflect a lateral wave generated during the resonance into the active area to trap resonance energy in the active area.

The passivation layer 1760 may be formed on the lower electrode 1730 and a region of the upper electrode except for a portion of the upper electrode 1750. The passivation layer 1760 may prevent damage to the upper electrode 1750 and the lower electrode 1730 during the process.

Further, in order to control a frequency in a final process, a thickness of the passivation layer 1760 may be controlled by etching. The same material as the material of the membrane layer 1720 may be used as a material of the passivation layer 1760. As an example, a dielectric layer containing any one of manganese oxide (MgO), zirconium oxide ($ZrO_2$), aluminum nitride (AlN), lead zirconate titanate (PZT), gallium arsenic (GaAs), hafnium oxide ($HfO_2$), aluminum oxide ($Al_2O_3$), titanium oxide ($TiO_2$), and zinc oxide (ZnO) may be used as the passivation layer 1760.

In addition, the metal pad 1770 may be formed on the lower electrode 1630 and the portion of the upper electrode 1750 on which the passivation layer 1760 is not formed. As an example, the metal pad 1770 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

Figure 31:
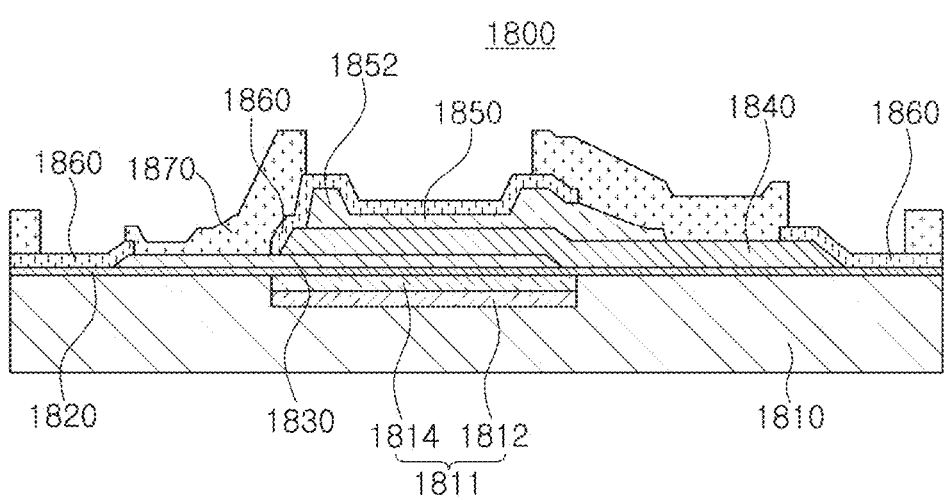
FIG. 31 is a schematic cross-sectional view illustrating a bulk acoustic wave resonator, according to another embodiment.

FIG. 31 is a schematic cross-sectional view illustrating a bulk acoustic wave resonator 1800, according to another exemplary embodiment in the present disclosure.

Referring to FIG. 31, the bulk acoustic wave resonator 1800 may include a substrate 1810, a membrane layer 1820, a lower electrode 130, a piezoelectric layer 1840, an upper electrode 1850, a passivation layer 1860, and a metal pad 1870.

The substrate 1810 may be a substrate on which silicon is stacked. For example, a silicon wafer may be used as the substrate 1810. The substrate 1810 may include a reflective layer 1821.

The reflective layer 1811 may be disposed at the central portion of the substrate 1810 and may be disposed below an active area. Here, the active area refers to an area in which the lower electrode 1830, the piezoelectric layer 1840, and the upper electrode 1850 are all disposed to be overlapped with each other.

The reflective layer 1811 may include first and second reflective members 1812 and 1814 disposed in a groove in the substrate 1810. The first and second reflective members 1812 and 1814 may be formed of different materials.

The first reflective member 1812 may be formed of a conductive material such as molybdenum (Mo), or an alloy thereof. However, the material of the first reflective member 1812 is not limited to molybdenum (Mo), and the first reflective member 1812 may be formed of ruthenium (Ru), tungsten (W), iridium (Ir), platinum (Pt), copper (Cu), aluminum (Al), titanium (Ti), tantalum (Ta), nickel (Ni), chromium (Cr), or the like. In addition, a dielectric layer containing any one of silicon nitride ($Si_3N_4$), silicon oxide (SiO$_2$), manganese oxide (MgO), zirconium oxide (ZrO$_2$), aluminum nitride (AlN), lead zirconate titanate (PZT), gallium arsenic (GaAs), hafnium oxide (HfO$_2$), aluminum oxide (Al$_2$O$_3$), titanium oxide (TiO$_2$), and zinc oxide (ZnO) may be used as the second reflective member 1814. In addition, the first and second reflective members 1812 and 1814 may be formed as a pair, or the first and second reflective members 1812 and 1814 may be repeatedly formed as a pair.

The membrane layer 1820 may be formed to cover the reflective layer 1811 of the substrate 1810. A dielectric layer containing any one of silicon nitride (Si$_3$N$_4$), silicon oxide (SiO$_2$), manganese oxide (MgO), zirconium oxide (ZrO$_2$), aluminum nitride (AlN), lead zirconate titanate (PZT), gallium arsenic (GaAs), hafnium oxide (HfO$_2$), aluminum oxide (Al$_2$O$_3$), titanium oxide (TiO$_2$), and zinc oxide (ZnO) may be used as the membrane layer 1820.

A seed layer (not shown) formed of aluminum nitride (AlN) may be formed on the membrane layer 1820. That is, the seed layer may be disposed between the membrane layer 1820 and the lower electrode 1830. The seed layer may be formed of a dielectric or a metal having a hexagonal close-packed (HCP) crystal structure other than aluminum nitride (AlN). As an example, in a case in which the seed layer is formed of the metal, the seed layer may be formed of titanium (Ti).

The lower electrode 1830 may be formed on the membrane layer 1820. In addition, the lower electrode 1830 may be used as either one of an input electrode and an output electrode that inputs or outputs an electrical signal such as a radio frequency (RF) signal or the like.

The lower electrode 1830 may be formed of, for example, an aluminum alloy including scandium (Sc). As such, high power reactive sputtering may be increased with an increase in mechanical strength. Under such a deposition condition, an increase in surface roughness of the lower electrode 1830 may be prevented and high orientation growth of the piezoelectric layer 1840 may also be induced.

In addition, since scandium (Sc) is contained in the lower electrode 1830, chemical resistance of the lower electrode 1830 may be increased, which may thus reduce or eliminate a disadvantage caused when the lower electrode is formed of pure aluminum. Further, during the manufacturing process, stability of a process such as dry etching or wet etching may be provided. Further, in the case in which the lower electrode is formed of pure aluminum, oxidation is easily caused, but since the lower electrode 1830 is formed of the aluminum alloy including scandium, chemical resistance against oxidation may be increased.

The piezoelectric layer 1840 may cover at least a portion of the lower electrode 1830. The piezoelectric layer 1840, which is a portion generating a piezoelectric effect that converts electric energy into mechanical energy in a form of elastic wave, may be formed of any one of aluminum nitride (AlN), zinc oxide (ZnO), and lead zirconium titanium oxide (PZT; PbZrTiO). In particular, in a case in which the piezoelectric layer 1840 is formed of aluminum nitride (AlN), the piezoelectric layer 1840 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). In addition, the transition metal may also include magnesium (Mg), which is a divalent metal.

The upper electrode 1850 may be formed to at least cover a portion of the piezoelectric layer 1840 disposed on the cavity C. The upper electrode 1850 may be used as either one of an input electrode and an output electrode that inputs and outputs an electrical signal such as a radio frequency (RF) signal, or the like. That is, in a case in which the lower electrode 1830 is used as the input electrode, the upper electrode 1850 may be used as the output electrode, and in a case in which the lower electrode 1830 is used as the output electrode, the upper electrode 1850 may be used as the input electrode.

The upper electrode 1850 may also be formed of an aluminum alloy including scandium (Sc) like the lower electrode 1830.

In addition, the upper electrode 1850 may include a frame portion 1852 disposed at an edge of the active area. The frame portion 1852 may have a thickness greater than the remaining portion of the upper electrode 1850. As an example, the frame portion 1852 may reflect a lateral wave generated during the resonance into the active area to trap resonance energy in the active area.

The passivation layer 1860 may be formed on the lower electrode 1830 and a region of the upper electrode 1850 except for a portion of the upper electrode 1850. The passivation layer 1860 may prevent damage on the upper electrode 1850 and the lower electrode 1830 during the manufacturing process.

Further, in order to control a frequency in a final process, a thickness of the passivation layer 1860 may be controlled by etching. The same material as the material of the membrane layer 1820 may be used as a material of the passivation layer 1860. As an example, a dielectric layer containing any one of manganese oxide (MgO), zirconium oxide (ZrO$_2$), aluminum nitride (AlN), lead zirconate titanate (PZT), gallium arsenic (GaAs), hafnium oxide (HfO$_2$), aluminum oxide (Al$_2$O$_3$), titanium oxide (TiO$_2$), and zinc oxide (ZnO) may be used as the passivation layer 1860.

In addition, the metal pad 1870 may be formed on the lower electrode 1830 and the portion of the upper electrode 1850 on which the passivation layer 1860 is not formed. As an example, the metal pad 1870 may be formed of a material such as gold (Au), a gold-tin (Au—Sn) alloy, copper (Cu), a copper-tin (Cu—Sn) alloy, aluminum (Al), an aluminum alloy, or the like. For example, the aluminum alloy may be an aluminum-germanium (Al—Ge) alloy.

Figure 32:
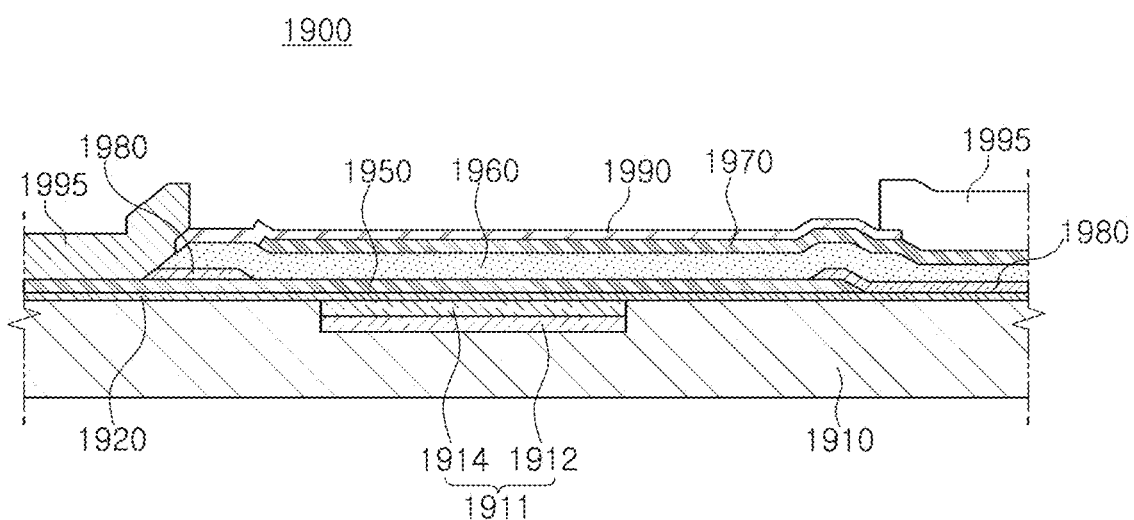
FIG. 32 is a schematic cross-sectional view illustrating a bulk acoustic wave resonator, according to another embodiment.

FIG. 32 is a schematic cross-sectional view illustrating a bulk acoustic wave resonator 1900, according to another embodiment.

Referring to FIG. 32, the bulk acoustic wave resonator 1900 may include the substrate 1810, the membrane layer 1820, a lower electrode 1950, a piezoelectric layer 1960, an upper electrode 1970, an insertion layer 1980, a passivation layer 1990, and a metal pad 1995.

Since the substrate 1810 and the membrane layer 1820 included in the bulk acoustic wave resonator 1900 are the same components as the corresponding components included in the bulk acoustic wave resonator 1800, a detailed description of the substrate 1810 and the membrane layer 1820 will be omitted and will be replaced with the description above.

In addition, since the lower electrode 1950, the piezoelectric layer 1960, the upper electrode 1970, the insertion layer 1980, the passivation layer 1990, and the metal pad 1995 included in the bulk acoustic wave resonator 1900 are the same components as the lower electrode 150, the piezoelectric layer 160, the upper electrode 170, the insertion layer 180, the passivation layer 190, and the metal pad 195 included in the bulk acoustic wave resonator 100, a detailed description thereof will be omitted and will be replaced with the description above.

The insertion layer 1980 may be disposed between the lower electrode 1950 and the piezoelectric layer 1960. The insertion layer 1980 may be formed of a dielectric such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the piezoelectric layer 1960. In addition, a region in which the insertion layer 1980 is formed may also be formed as an air space, as needed. This may be implemented by removing the insertion layer 1980 during the manufacturing process.

According to the embodiment of FIG. 32, a thickness of the insertion layer 1980 may be the same as or similar to a thickness of the lower electrode 1950. In addition, the thickness of the insertion layer 1980 may be similar to or less than the thickness of the piezoelectric layer 1960. For example, the insertion layer 1980 may have the thickness of 100 Å or more, and may have the thickness less than the thickness of the piezoelectric layer 1960. However, the configuration of the insertion layer 1980, the lower electrode 1950, and the piezoelectric layer 1960 is not limited to the foregoing description.

Since the insertion layer 1980 is the same component as the insertion layer 180 included in the bulk acoustic wave resonator 100 described above, a detailed description thereof will be omitted and will be replaced with the description above.

As set forth above, according to the embodiments disclosed herein, the bulk acoustic wave resonator may reduce deteriorations in performance in the driving condition of the high frequency (e.g., 6 GHz) and may be easily manufactured.

According to the disclosed embodiments, when the resonator of a band of 4 to 6 GHz is implemented, electrical loss may be reduced and crystal orientation of the piezoelectric layer may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
a substrate;
a lower electrode disposed on the substrate;
a piezoelectric layer disposed on the lower electrode; and
an upper electrode disposed on the piezoelectric layer,
wherein either one or both of the lower electrode and the upper electrode comprises a layer of aluminum alloy including scandium (Sc).

2. The bulk acoustic wave resonator of claim 1, wherein both of the lower electrode and the upper electrode comprise the layer of aluminum alloy including scandium (Sc).

3. The bulk acoustic wave resonator of claim 2, wherein the upper electrode further comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

4. The bulk acoustic wave resonator of claim 3, wherein the lower electrode further comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

5. The bulk acoustic wave resonator of claim 2, wherein the lower electrode further includes a layer formed of any one molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

6. The bulk acoustic wave resonator of claim 1, wherein only the lower electrode comprises the layer of aluminum alloy including scandium (Sc), and
the upper electrode comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

7. The bulk acoustic wave resonator of claim 6, wherein the lower electrode further comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

8. The bulk acoustic wave resonator of claim 1, wherein only the upper electrode comprises the layer of aluminum alloy including scandium (Sc), and
the lower electrode comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

9. The bulk acoustic wave resonator of claim 8, wherein the upper electrode further comprises a layer formed of any one of molybdenum (Mo), ruthenium (Ru), tungsten (W), iridium (Ir), platinum (Pt), copper (Cu), titanium (Ti), tantalum (Ta), nickel (Ni), and chromium (Cr), or an alloy including any one of molybdenum (Mo), ruthenium (Ru), tungsten (W), iridium (Ir), platinum (Pt), copper (Cu), titanium (Ti), tantalum (Ta), nickel (Ni), and chromium (Cr).

10. The bulk acoustic wave resonator of claim 1, wherein a content of scandium (Sc) is 0.1 to 5 at %.

11. The bulk acoustic wave resonator of claim 1, wherein the piezoelectric layer comprises either one of aluminum nitride and doped aluminum nitride containing a rare earth metal.

12. The bulk acoustic wave resonator of claim 11, wherein the piezoelectric layer comprises the doped aluminum nitride containing the rare earth metal,
the doped aluminum nitride comprises a dopant selected from the group consisting of scandium, erbium, yttrium, lanthanum, and a metal including a combination of any two or more of scandium, erbium, yttrium, and lanthanum, and
a content of the dopant is 0.1 to 30 at %.

13. The bulk acoustic wave resonator of claim 1, further comprising an etch stop portion disposed between the substrate and the lower electrode and disposed around a cavity.

14. The bulk acoustic wave resonator of claim 1, further comprising an insertion layer disposed below a region of a portion of the piezoelectric layer.

15. The bulk acoustic wave resonator of claim 1, wherein a cavity is formed in the substrate or on the substrate.

16. The bulk acoustic wave resonator of claim 1, wherein the upper electrode comprises a frame portion disposed at an edge of an active area.

17. The bulk acoustic wave resonator of claim 1, further comprising a reflective layer embedded in a groove in the substrate, or stacked on the substrate.

18. The bulk acoustic wave resonator of claim 17, wherein the reflective layer comprises a first reflective member and a second reflective member disposed on the first reflective member, and
the first and second reflective members are formed as a pair or are formed as a plurality of pairs in which the first and second reflective members are alternately disposed.

19. A bulk acoustic wave resonator, comprising:
a lower electrode disposed on a piezoelectric layer; and
an upper electrode disposed on the piezoelectric layer,
wherein either one or both of the lower electrode and the upper electrode is formed of a material comprising a lower acoustic impedance than molybdenum (Mo), a mechanical strength greater than 35 MPa, and a higher chemical resistance than aluminum (Al).

20. The bulk acoustic wave resonator of claim 19, wherein the material comprises greater galvanic corrosion resistance than aluminum as determined in electrolytic solution in contact with gold.

21. The bulk acoustic wave resonator of claim 19, wherein the material is an aluminum (Al) binary alloy.

22. The bulk acoustic wave resonator of claim 19, wherein the piezoelectric layer consists essentially of crystals oriented <1.73° (0002) full width at half maximum (FWHM).

23. The bulk acoustic wave resonator of claim 19, wherein the material consists essentially of crystals oriented <1.13° (111) full width at half maximum (FWHM).

24. The bulk acoustic wave resonator of claim 19, wherein the material is formed of an aluminum alloy including scandium (Sc).

25. A bulk acoustic wave resonator, comprising:
a lower electrode comprising a first lower electrode layer disposed on a substrate, and a second lower electrode layer disposed on top of the first lower electrode layer;
a piezoelectric layer disposed on top of the lower electrode; and
an upper electrode disposed on top of the piezoelectric layer,
wherein one of the first and second lower electrode layers is formed of an aluminum alloy including scandium (Sc), and the other of the first and second lower electrode layers is formed of a material other than the aluminum alloy including scandium (Sc).

26. The bulk acoustic wave resonator of claim 25, wherein a content of the scandium (Sc) in the aluminum alloy is 0.1 to 5 at %.

27. The bulk acoustic wave resonator of claim 25, wherein the upper electrode is formed of molybdenum (Mo).

28. The bulk acoustic wave resonator of claim 25, wherein the upper electrode is formed of the aluminum alloy including scandium (Sc).

* * * * *